(12) United States Patent
Tang et al.

(10) Patent No.: US 12,512,405 B2
(45) Date of Patent: Dec. 30, 2025

(54) SEMICONDUCTOR PACKAGE AND METHOD OF MANUFACTURING THE SAME

(71) Applicant: Taiwan Semiconductor Manufacturing Company, Ltd., Hsinchu (TW)

(72) Inventors: Tzu-Chun Tang, Kaohsiung (TW); Chung-Hao Tsai, Changhua County (TW); Chuei-Tang Wang, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 114 days.

(21) Appl. No.: 17/460,339

(22) Filed: Aug. 30, 2021

(65) Prior Publication Data

US 2023/0065844 A1   Mar. 2, 2023

(51) Int. Cl.
*H01L 23/522* (2006.01)
*H01L 23/00* (2006.01)
(Continued)

(52) U.S. Cl.
CPC ........ *H01L 23/5227* (2013.01); *H01L 23/481* (2013.01); *H01L 23/49816* (2013.01);
(Continued)

(58) Field of Classification Search
CPC . H01L 2224/08146; H01L 2224/08147; H01L 2224/48091; H01L 2225/06524; H01L 2225/06541; H01L 2225/06548; H01L 23/481; H01L 23/49816; H01L 23/49822; H01L 23/49827; H01L 23/5226; H01L 23/5227; H01L 23/5383;
(Continued)

(56) References Cited

U.S. PATENT DOCUMENTS

| 9,331,021 | B2 * | 5/2016 | Yu | H01L 23/3128 |
| 10,102,967 | B2 * | 10/2018 | Beer | H01F 17/0013 |
| 11,309,243 | B2 * | 4/2022 | Chen | H01L 24/05 |
| 11,315,891 | B2 * | 4/2022 | Tsai | H01L 24/20 |

(Continued)

FOREIGN PATENT DOCUMENTS

| CN | 107644859 A | * | 1/2018 | ......... H01L 21/6835 |
| CN | 107924907 A | * | 4/2018 | ......... H01L 21/4846 |
| DE | 102018129019 A1 | * | 11/2019 | ......... H01L 21/4857 |

*Primary Examiner* — Telly D Green
(74) *Attorney, Agent, or Firm* — JCIPRNET

(57) ABSTRACT

A semiconductor package is provided. The semiconductor package includes a first die and a second die bonded to the first die. An encapsulant laterally encapsulates the second die. Through vias are disposed in the encapsulant. An interconnect structure is disposed on the second die, the through vias and the encapsulant. A redistribution structure is disposed on the interconnect structure. An inductor is embedded in the redistribution structure and the interconnect structure, wherein the inductor includes a portion of a metallization pattern of the redistribution structure and a portion of a conductive pattern of the interconnect structure. The portion of the metallization pattern of the inductor is adjacent to and substantially overlapped with the portion of the conductive pattern of the inductor. A manufacturing method of a semiconductor package is also provided.

20 Claims, 22 Drawing Sheets

(51) Int. Cl.
*H01L 23/48* (2006.01)
*H01L 23/498* (2006.01)
*H01L 23/538* (2006.01)
*H01L 25/065* (2023.01)

(52) U.S. Cl.
CPC .. *H01L 23/49822* (2013.01); *H01L 23/49827* (2013.01); *H01L 23/5226* (2013.01); *H01L 23/5386* (2013.01); *H01L 24/08* (2013.01); *H01L 24/16* (2013.01); *H01L 25/0657* (2013.01); *H01L 2224/08146* (2013.01); *H01L 2224/08147* (2013.01); *H01L 2224/48091* (2013.01); *H01L 2225/06541* (2013.01); *H01L 2225/06548* (2013.01); *H01L 2924/15311* (2013.01); *H01L 2924/18161* (2013.01)

(58) Field of Classification Search
CPC . H01L 23/5386; H01L 23/5389; H01L 24/08; H01L 24/16; H01L 25/0657; H01L 25/16; H01L 25/50; H01L 2924/15311; H01L 2924/18161
See application file for complete search history.

(56) References Cited

U.S. PATENT DOCUMENTS

| | | | |
|---|---|---|---|
| 11,450,628 B2* | 9/2022 | Tang | H01L 23/5227 |
| 2006/0291029 A1* | 12/2006 | Lin | H01L 24/12 |
| | | | 257/E21.589 |
| 2008/0157340 A1* | 7/2008 | Yang | H01L 23/467 |
| | | | 257/691 |
| 2008/0157341 A1* | 7/2008 | Yang | H01L 23/467 |
| | | | 257/E21.507 |
| 2014/0070422 A1* | 3/2014 | Hsiao | H01L 21/486 |
| | | | 438/618 |
| 2014/0264933 A1* | 9/2014 | Yu | H01L 23/3128 |
| | | | 257/774 |
| 2015/0318246 A1* | 11/2015 | Yu | H01L 21/76807 |
| | | | 257/774 |
| 2016/0358889 A1* | 12/2016 | Lai | H01L 21/768 |
| 2018/0358312 A1* | 12/2018 | Yu | H01Q 1/2283 |
| 2019/0019756 A1* | 1/2019 | Yu | H01L 23/66 |
| 2019/0295972 A1* | 9/2019 | Tsai | H01L 21/4857 |
| 2019/0355680 A1* | 11/2019 | Chuang | H01L 23/5389 |
| 2020/0161266 A1* | 5/2020 | Shim | H01L 21/568 |
| 2020/0411445 A1* | 12/2020 | Chen | H01L 21/4857 |
| 2021/0066192 A1* | 3/2021 | Chen | H01L 25/50 |
| 2021/0183794 A1* | 6/2021 | Tang | H01L 23/481 |
| 2022/0246524 A1* | 8/2022 | Chen | H01L 23/3107 |

* cited by examiner

SEMICONDUCTOR PACKAGE AND METHOD OF MANUFACTURING THE SAME

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows smaller components to be integrated into a given area. These smaller electronic components also demand smaller packages that utilize less area than previous packages. Some smaller types of packages for semiconductor components include quad flat packages (QFPs), pin grid array (PGA) packages, ball grid array (BGA) packages, flip chips (FC), three-dimensional integrated circuits (3DICs), wafer level packages (WLPs), and package on package (PoP) devices and so on. The formation of the redistribution circuit structure also plays an important role during packaging process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 through FIG. 10A are schematic cross-sectional views illustrating intermediate steps during a process for forming a semiconductor package having an inductor in accordance with some embodiments of the disclosure.

DESCRIPTION OF THE EMBODIMENTS

Figure 1:
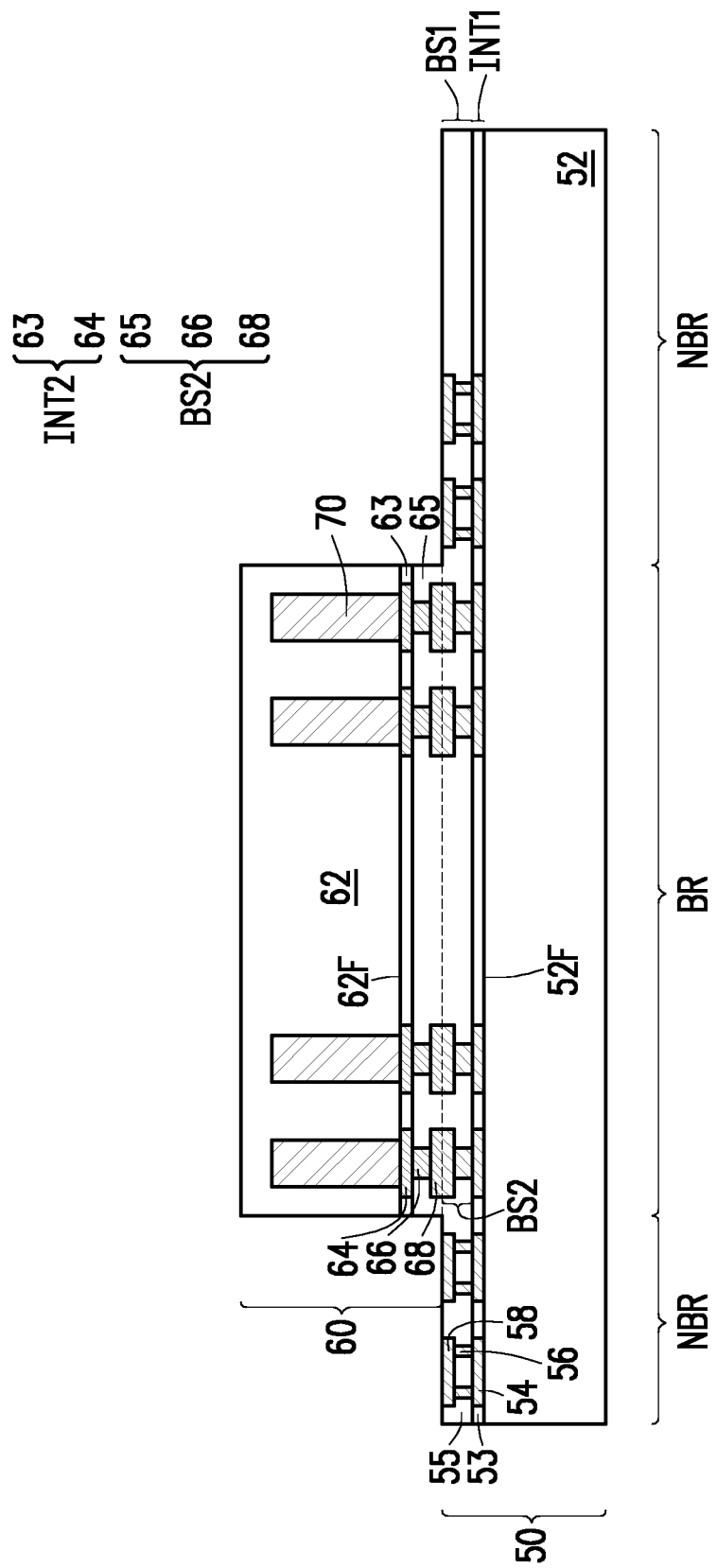

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An inductor is a passive electrical component that can store energy in a magnetic field created by an electric current passing through it. An inductor may be constructed as a coil of conductive material wrapped around a core of dielectric or magnetic material. One parameter of an inductor that may be measured is the inductor's ability to store magnetic energy, also known as the inductor's inductance. Another parameter that may be measured is the inductor's Quality (Q) factor. The Q factor of an inductor is a measure of the inductor's efficiency and may be calculated as the ratio of the inductor's inductive reactance to the inductor's resistance at a given frequency. The inductor's resistance causes energy loss and results in a decrease of Q factor, which may further limit the performance of the inductor.

Embodiments discussed herein may be discussed in a specific context, namely a semiconductor package structure, such as a system-on-integrated chip (SoIC) package, and a method of forming the same. Embodiments such as those disclosed herein integrate an inductor within the semiconductor package structure, and the inductor therein is formed with a portion of a metallization pattern of a redistribution structure and a portion of a conductive pattern of a die stack structure. The disclosed embodiments also include a semiconductor package having a 3D solenoid inductor, and the 3D solenoid inductor therein is formed with portions of a metallization pattern of a front-side redistribution structure, portions of a metallization pattern of a back-side redistribution structure, and through vias connecting the respective metallization patterns.

Further, the teachings of this disclosure are applicable to any package structure including redistribution structures. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the components may be sufficient to convey aspects of the embodiment. Further, method embodiments discussed herein may be discussed as being performed in a particular order; however, other method embodiments may be performed in any logical order.

FIG. 1 through FIG. 10A are schematic cross-sectional views illustrating intermediate steps during a process for forming a semiconductor package having an inductor in accordance with some embodiments of the disclosure. Referring to FIG. 1, a first integrated circuit die 50 and a second integrated circuit die 60 are provided. In some embodiments, the first integrated circuit die 50 may be a logic device, such as a central processing unit (CPU), a graphics processing unit (GPU), a system-on-a-chip (SoC), a microcontroller, or the like. In some embodiments, the second integrated circuit die 60 and the first integrated circuit dies 50 may be the same type of dies, such as SoC dies. In other embodiments, the second integrated circuit die 60 and the first integrated circuit die 50 may be the different types of die. The second integrated circuit die 60 and the first integrated circuit die 50 may be formed in processes of a same technology node, or may be formed in processes of different technology nodes. For example, the first integrated circuit die 50 may be of a more advanced process node than the second integrated circuit die 60. The second integrated circuit die 60 and the first integrated circuit die 50 may have different sizes (e.g., different heights and/or surface areas), or may have the same size (e.g., same heights and/or surface areas).

As shown in FIG. 1, the first integrated circuit die 50 includes a semiconductor substrate 52 and a first interconnect structure INT1 disposed on a front-side (e.g., active side) surface 52F of the semiconductor substrate 52. In some embodiments, the semiconductor substrate 52 may be made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. In some embodiments, the first interconnect structure INT1 includes an inter-metal dielectric layer 53 and a conductive pattern 54 embedded in the inter-metal dielectric layer 53. For simplicity, the first interconnect structure INT1 is illustrated as one single inter-metal dielectric layer 53 with the conductive pattern 54 embedded therein, as shown in FIG. 1. In some alternative embodiments, the number of the inter-metal dielectric layers 53 and the number of the conductive pattern 54 may be adjusted depending on the routing requirements.

In some embodiments, a material of the inter-metal dielectric layer 53 includes silicon oxide, silicon nitride, silicon oxynitride, polyimide, epoxy resin, acrylic resin, phenol resin, benzocyclobutene (BCB), polybenzoxazole (PBO), combinations thereof, or other suitable dielectric materials. The inter-metal dielectric layer 53 may be formed by suitable fabrication techniques such as spin-on coating, lamination, chemical vapor deposition (CVD), or the like. In some embodiments, the material of the conductive pattern 54 includes aluminum, titanium, copper, nickel, tungsten, and/or alloys thereof. In some embodiments, the conductive pattern 54 may be formed by electroplating, deposition, and/or photolithography and etching.

In some embodiments, the first integrated circuit die 50 further includes a bonding dielectric layer 55, pads 58 and vias 56 electrically connecting the pads 58 to the underlying conductive pattern 54. As illustrated in the FIG. 1, the pads 58 and the vias 56 are embedded in the bonding dielectric layer 55. In some other embodiments, the bonding dielectric layer 55, the pads 58 and the vias 56 are collectively referred to as a first bonding structure BS1 of the first integrated circuit die 50. In some other embodiments, the first bonding structure BS1 has a bonding region BR and a non-bonding region NBR, and the pads 55 inside the bonding region BR may be referred to as bonding pads.

In some embodiments, a material of the bonding dielectric layers 55 includes oxides such as silicon dioxide, polyimide, epoxy resin, acrylic resin, phenol resin, BCB, PBO, other suitable polymer-based dielectric material, or a combination thereof. In some embodiments, the bonding dielectric layers 55 are formed by spin-on coating, CVD, plasma enhanced CVD, or the like. In some embodiments, a material of the pads 58 and the vias 56 may include aluminum, titanium, copper, nickel, tungsten, and/or alloys thereof. In some embodiments, the pads 58 and the vias 56 may be formed by electroplating, deposition, and/or photolithography and etching.

Similar to the first integrated circuit die 50, the second integrated circuit die 60 includes a semiconductor substrate 62 and a second interconnect structure INT2 disposed on a front-side (e.g., active side) surface 62F of the semiconductor substrate 62. In some embodiments, the semiconductor substrate 62 may be similar to the semiconductor substrate 52 of the first integrated circuit die 50. In some embodiments, the second interconnect structure INT2 includes an inter-metal dielectric layer 63 and a conductive pattern 64 embedded in the inter-metal dielectric layer 63. The second interconnect structure INT2 may be similar to the first interconnect structure INT1 of the first integrated circuit die 50. In some alternative embodiments, the second integrated circuit die 60 may further include through semiconductor vias (TSVs) 70. In some embodiments, the TSVs 70 penetrate through the semiconductor substrate 62 for dual-side connection after processing (shown in FIG. 4). As illustrated in FIG. 1, a first end of a TSV 70 is embedded in the second interconnect structure INT2 and a second end of the TSV 70 is embedded in the semiconductor substrate 62. That is, the TSV 70 extends from the second interconnect structure INT2 to the semiconductor substrate 62. It is understood that four TSVs 70 are shown in FIG. 1 for exemplary illustration, and the disclosure is not limited thereto. In some embodiments, the second integrated circuit die 60 may include fewer or more TSVs 70.

In some embodiments, the second integrated circuit die 60 further includes a bonding dielectric layer 65, pads 68 and vias 66 electrically connecting the pads 68 to the underlying conductive pattern 64. As illustrated in the FIG. 1, the pads 68 and the vias 66 are embedded in the bonding dielectric layer 65. In some other embodiments, the bonding dielectric layer 65, the pads 68 and the vias 66 are collectively referred to as a second bonding structure BS2 of the second integrated circuit die 60. In some embodiments, a material of the bonding dielectric layers 65 includes oxides such as silicon dioxide, polyimide, epoxy resin, acrylic resin, phenol resin, BCB, PBO, other suitable polymer-based dielectric material, or a combination thereof. In some embodiments, the bonding dielectric layers 65 are formed by spin-on coating, CVD, plasma enhanced CVD, or the like. In some embodiments, a material of the pads 68 and the vias 66 may include aluminum, titanium, copper, nickel, tungsten, and/or alloys thereof. In some embodiments, the pads 68 and the vias 66 may be formed by electroplating, deposition, and/or photolithography and etching.

Still referring to FIG. 1, the second integrated circuit die 60 is bonded to the first integrated circuit die 50 at the bonding region BR. In the illustrated embodiment, the second integrated circuit die 60 is bonded to the first integrated circuit die 50 through a hybrid bonding method. The hybrid bonding method includes direct bonding the pads 68 of the second integrated circuit die 60 to the respective bonding pads 58 of the first integrated circuit die 50, and direct boding the bonding dielectric layer 65 of the second integrated circuit die 60 to the bonding dielectric layer 55 of the first integrated circuit die 50 at the bonding region BR. That is, the second integrated circuit die 60 is stacked on the first integrated circuit die 50 at the bonding region BR in a "face-to-face" manner. In some embodiments, the direct contact between the pads 58 and the pads 68 may establish electrical connection between the first integrated circuit die 50 and the second integrated circuit die 60.

Figure 2:
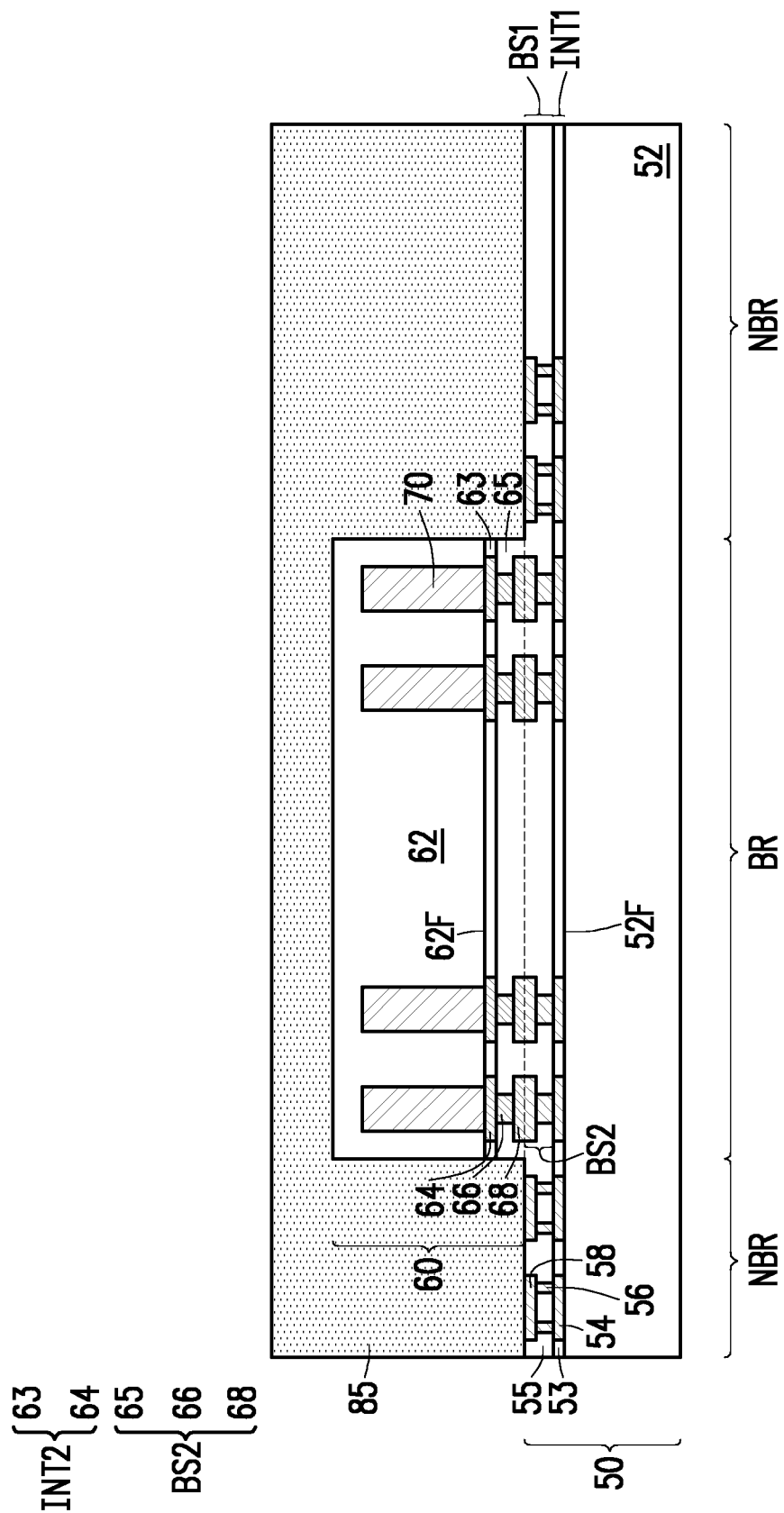

Referring to FIG. 2, a dielectric layer 85 is formed over the first integrated circuit die 50 and the second integrated circuit die 60 such that the second integrated circuit die 60 is buried or covered. The dielectric layer 85 may referred to as a gap-filling layer or an encapsulant. In some embodiments the, dielectric layer 85 includes an oxide such as silicon oxide, which may be formed using tetraethyl orthosilicate (TEOS). The formation method may include Chemical Vapor Deposition (CVD), High-Density Plasma Chemical Vapor Deposition (HDPCVD), or the like. In accordance with alternative embodiments, the dielectric layer 85 is formed of a polymer such as PBO, polyimide, or the like. In some embodiments, a sidewall of the dielectric layer 85 is substantially aligned with a sidewall of the first integrated circuit die 50.

Figure 3:
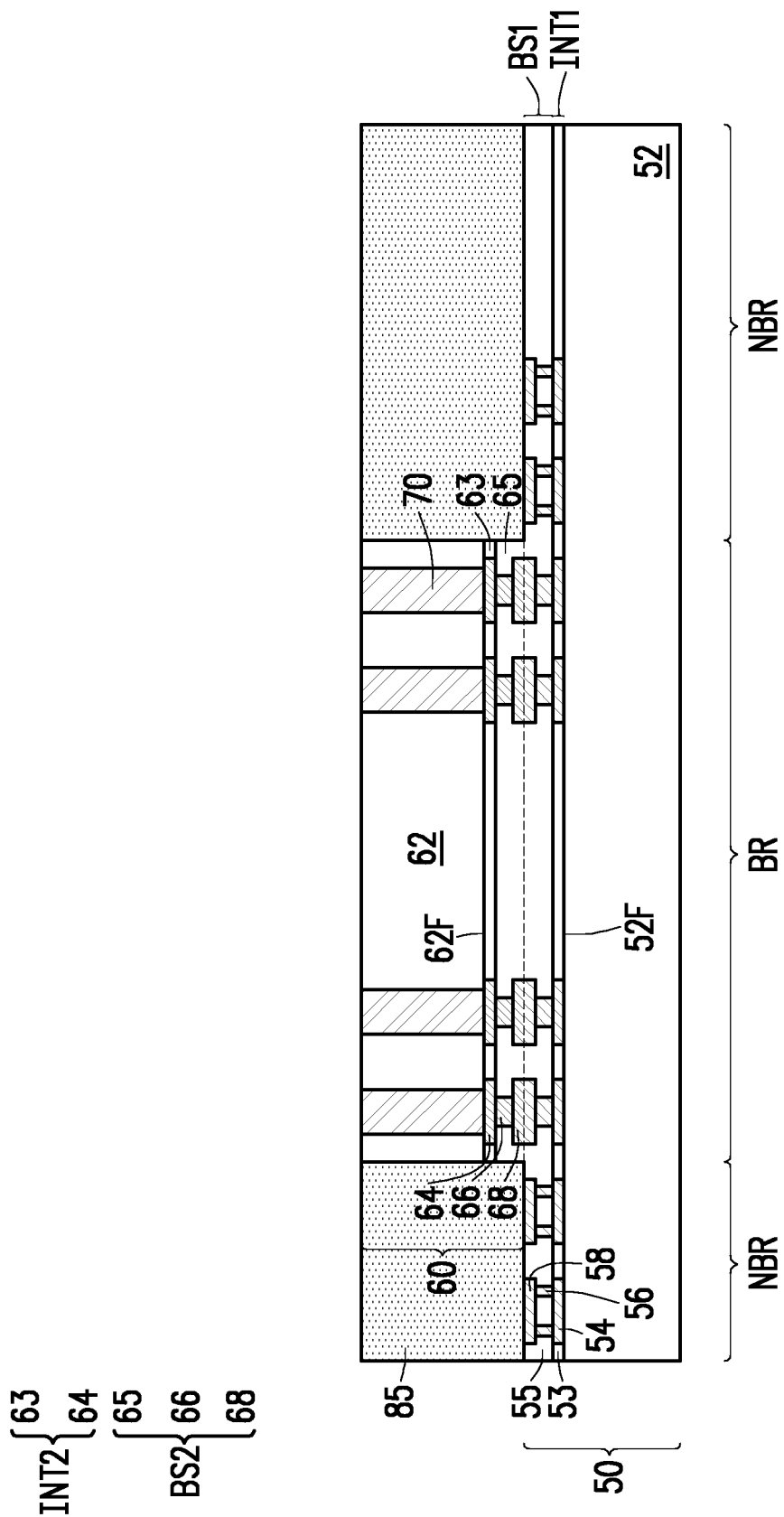

In FIG. 3, a planarization process is performed to thin the dielectric layer 85 until surfaces of the TSVs 70 are exposed. In some embodiments, portions of the TSVs 70 may also be removed during the planarization process. In some embodiments, upon completion of the planarization process, the surfaces of the TSVs 70 and a top surface of the dielectric layer 85 may be substantially coplanar. The planarization process may be, for example, a chemical-mechanical polish (CMP), a grinding process, the like, or a combination thereof. In some embodiments, the planarization may be omitted, for example, if the TSVs 70 are already exposed.

Figure 4:
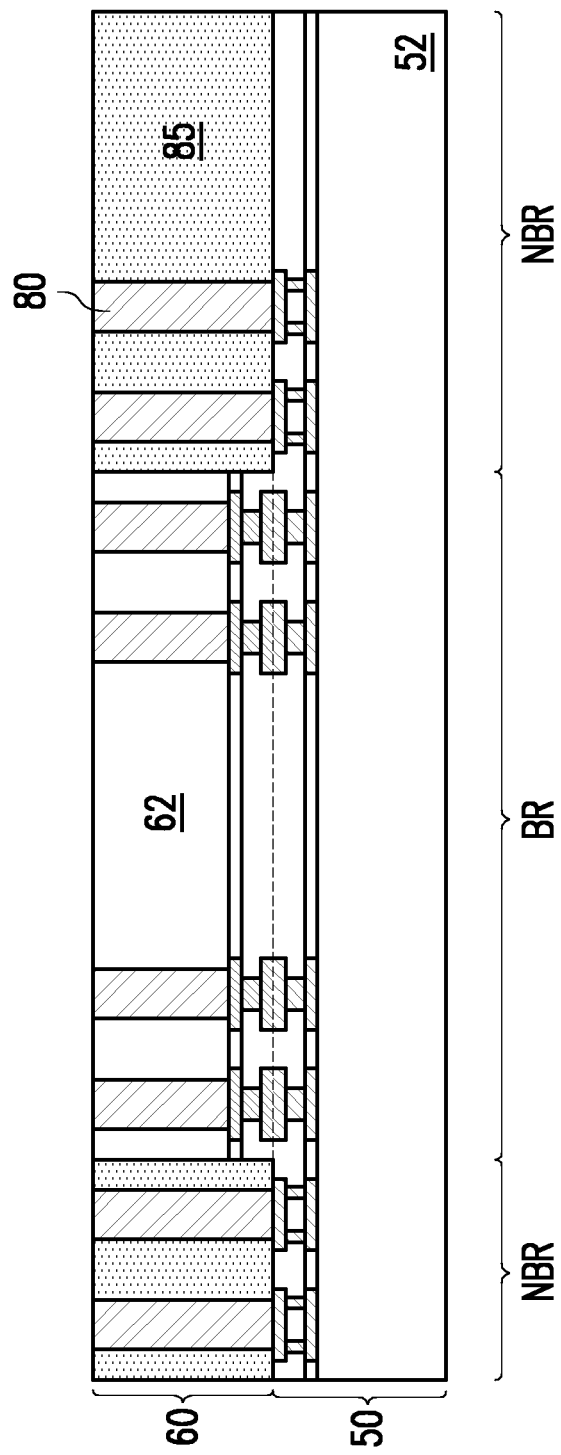

FIG. 4 illustrates the formation of through vias 80, which are formed by etching-through the dielectric layer 85 in an anisotropic etching step to form via openings, and filling the respective openings with a conductive material(s). In some embodiments, a photoresist (not shown) is formed and patterned, and the dielectric layer 85 are etched using the patterned photoresist as an etching mask. In some embodiments, the pads 58 located at the non-bonding area NBR are exposed to the via openings, wherein the etching may be performed using the pads 58 as etch stop layers. The via openings are then filled with the conductive materials to form the through vias 80 by performing a plating process such as an electrical-chemical plating process or an electroless plating process. In some embodiments, the through vias 80 may include a metallic material such as tungsten, aluminum, copper, or the like. A conductive barrier layer (such as titanium, titanium nitride, tantalum, tantalum nitride, or the like) may also be formed underlying the metallic material. In some alternative embodiments, a planarization such as a CMP is performed to remove excess portions of the plated metallic material, and the remaining portions of the metallic material form the through vias 80. As illustrated in FIG. 4, the through vias 80 are physically and electrically connected to the respective pads 58 of the first integrated circuit die 50 at the non-bonding area NBR. In some embodiments, the through vias 80 may have substantially straight and vertical sidewalls, but the disclosure is not limited thereto. In some embodiments, the through vias 80 may have a tapered profile, with top widths slightly greater than the respective bottom widths.

Figure 5:
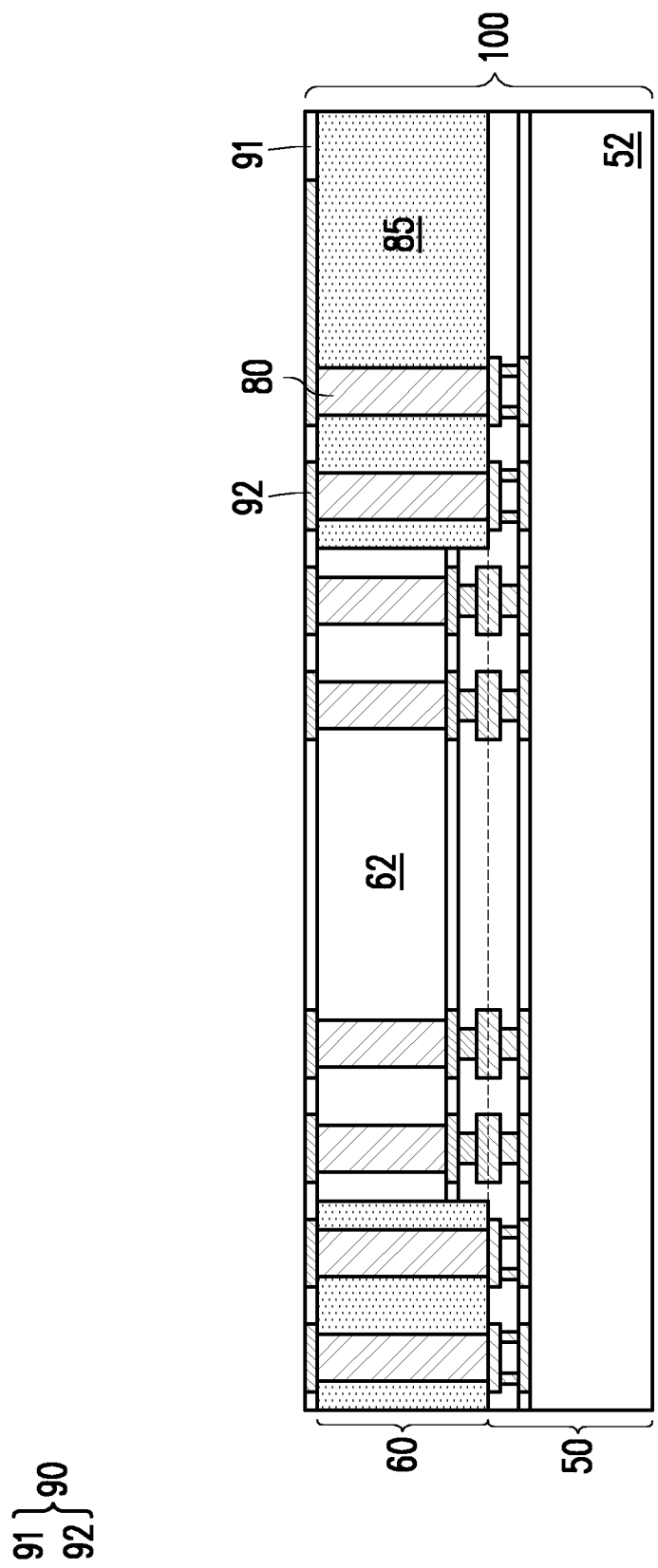

Referring to FIG. 5, a back-side interconnect structure 90 is formed over the dielectric layer 85, the through vias 80 and the second integrated circuit die 60. The back-side interconnect structure 90 includes an inter-metal dielectric layer 91 and a conductive pattern 92. In some embodiments, a material of the inter-metal dielectric layer 91 includes polyimide, epoxy resin, acrylic resin, phenol resin, BCB, PBO, combinations thereof, or other suitable dielectric materials. The inter-metal dielectric layer 91 may be formed by suitable fabrication techniques such as spin-on coating, lamination, CVD, or the like. In some embodiments, the material of the conductive pattern 92 includes aluminum, titanium, copper, nickel, tungsten, and/or alloys thereof. In some embodiments, the conductive pattern 92 may be formed by electroplating, deposition, and/or photolithography and etching.

Figure 6:
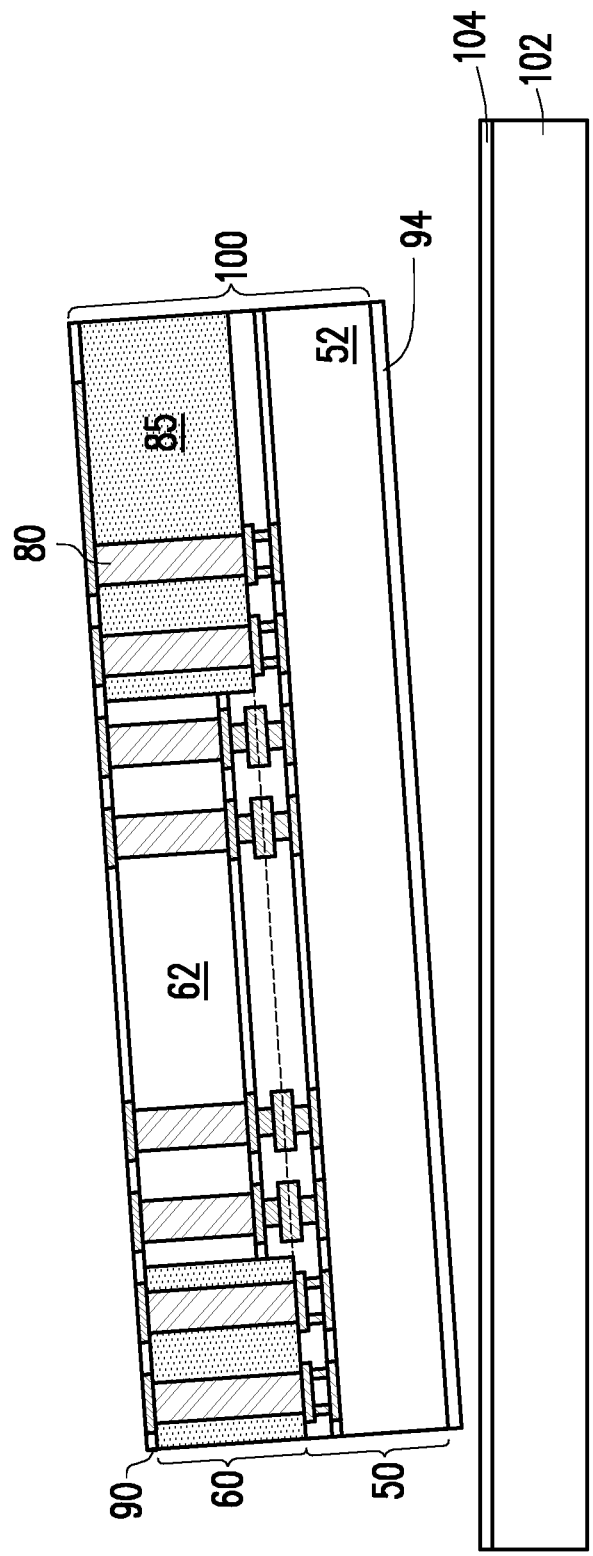

After forming the back-side interconnect structure 90, a die stack structure 100 is obtained. Referring to FIG. 6, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously.

The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

Still referring to FIG. 6, the die stack structure 100 is adhered to the release layer 104 by an adhesion layer 94. Optionally, the adhesion layer 94 may be on back-side of the die stack structure 100 in order to adhere the die stack structure 100 to the over the surface of the carrier substrate 102, such as over the release layer 104. The adhesion layer 94 may be any suitable adhesive, epoxy, die attach film (DAF), or the like. The adhesion layer 94 may be applied to back-side of the die stack structure 100 or over the surface of the carrier substrate 102 (e.g., over the release layer 104).

Figure 7:
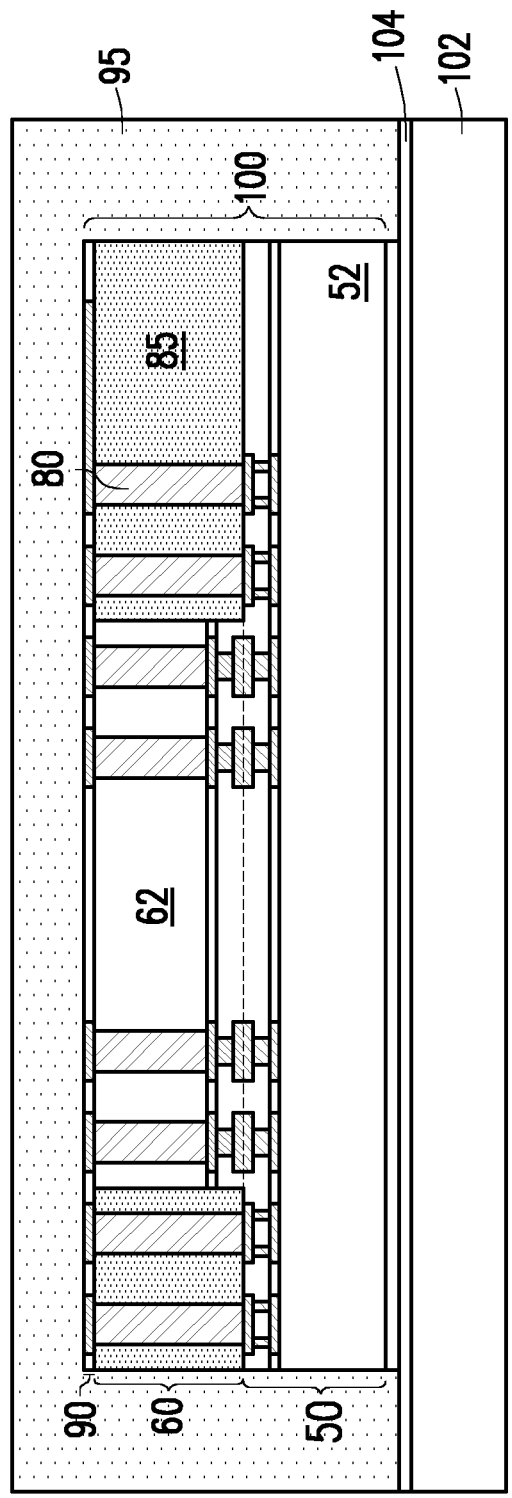

In FIG. 7, the die stack structure 100 over the carrier substrate 102 is molded and encapsulated in the encapsulant 95. In some embodiments, the encapsulant 95 covers and laterally surrounds the die stack structure 100. In some embodiments, the material of the encapsulant 95 includes epoxy resins, phenolic resins or silicon-containing resins. In some other embodiments, the material of the encapsulant 95 includes filler particles.

In some embodiments, the encapsulant 95 is over-molded and then planarized to expose the back-side interconnect structure 90 of the die stack structure 100. In some embodiments, after the planarization, a surface of the back-side interconnect structure 90 and a surface of the encapsulant 95 are substantially coplanar. In some embodiments, the encapsulant 95 is planarized through a grinding process or a CMP process.

Figure 8:
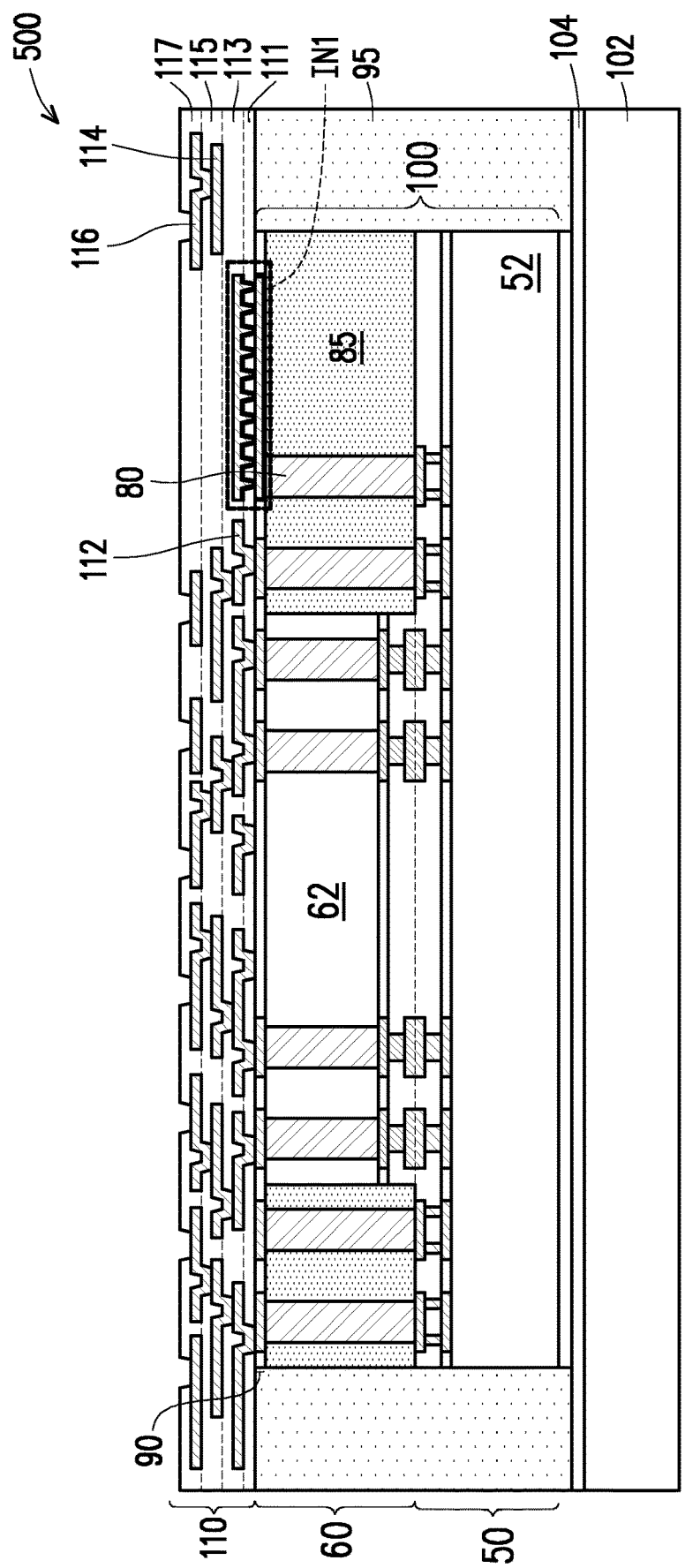

Referring to FIG. 8, a redistribution structure 110 is formed over the encapsulant 95 and the back-side interconnect structure 90 of the die stack structure 100. In some embodiments, a portion of the redistribution structure 110 and a portion of the back-side interconnect structure 90 may subsequently formed an inductor IN1 (see FIG. 10B). The redistribution structure 110 includes dielectric layers 111, 113, 115, and 117; and metallization patterns 112, 114, and 116. The metallization patterns may also be referred to as redistribution layers or redistribution lines. The redistribution structure 110 is shown as an example having three layers of metallization patterns. More or fewer dielectric layers and metallization patterns may be formed in the redistribution structure 110. If fewer dielectric layers and metallization patterns are to be formed, steps and process discussed below may be omitted. If more dielectric layers and metallization patterns are to be formed, steps and processes discussed below may be repeated.

In some embodiments, the dielectric layer 111 is deposited on the encapsulant 95 and the back-side interconnect structure 90 of the die stack structure 100. In some embodiments, the dielectric layer 111 is formed of a photo-sensitive material such as PBO, polyimide, BCB, or the like, which may be patterned using a lithography mask. The dielectric layer 111 may be formed by spin coating, lamination, CVD, the like, or a combination thereof. The dielectric layer 111 is then patterned. The patterning forms openings exposing portions of the conductive pattern 92. The patterning may be by an acceptable process, such as by exposing and developing the dielectric layer 111 to light when the dielectric layer 111 is a photo-sensitive material or by etching using, for example, an anisotropic etch.

The metallization pattern 112 is then formed. The metallization pattern 112 includes conductive elements extending along the surface of the dielectric layer 111 and extending through the dielectric layer 111 to physically and electrically connect to the conductive pattern 92. As an example to form the metallization pattern 112, a seed layer (not shown) is formed over the dielectric layer 111 and in the openings extending through the dielectric layer 111. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 112. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 112. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

In some embodiments, a dielectric layer 113 is deposited on the metallization pattern 112 and the dielectric layer 111. The dielectric layer 113 may be formed in a manner similar to the dielectric layer 111, and may be formed of a similar material as the dielectric layer 111. The metallization pattern 114 is then formed. The metallization pattern 114 includes portions on and extending along the surface of the dielectric layer 113. The metallization pattern 114 further includes portions extending through the dielectric layer 113 to physically and electrically connect the metallization pattern 112. The metallization pattern 114 may be formed in a similar manner and of a similar material as the metallization pattern 112. In some embodiments, the metallization pattern 114 has a different size than the metallization pattern 112. For example, the conductive lines and/or vias of the metallization pattern 114 may be wider or thicker than the conductive lines and/or vias of the metallization pattern 112. Further, the metallization pattern 114 may be formed to a greater pitch than the metallization pattern 112.

In some embodiments, as shown in FIG. 8, additional dielectric layers 115 and 117, as well as metallization pattern 116 are formed by repeating the processes described above. The dielectric layers 115 and 117 may be formed in a manner similar to the dielectric layer 111 and 113, and may be formed of a similar material as the dielectric layer 111 and 113. The metallization pattern 116 may be formed in a manner similar to the metallization patterns 112 and 114, and may be formed of a similar material as the metallization patterns 112 and 114.

In the embodiment shown, the metallization pattern 116 is the topmost metallization pattern of the redistribution structure 110. As such, all of the intermediate metallization patterns of the redistribution structure 110 (e.g., the metallization patterns 112 and 114) are disposed between the metallization pattern 116 and the die stack structure 100. In some embodiments, the metallization pattern 116 has a different size than the metallization patterns 112 and 114. For example, the conductive lines and/or vias of the metallization pattern 116 may be wider or thicker than the conductive lines and/or vias of the metallization patterns 112 and 114. Further, the metallization pattern 116 may be formed to a greater pitch than the metallization pattern 114. As discussed above, additional dielectric layers and metallization patterns may be included in the redistribution structure 110 by repeating steps described above. If fewer dielectric layers and metallization patterns are desired in the redistribution structure 110, then steps described above may be omitted.

Figure 9:
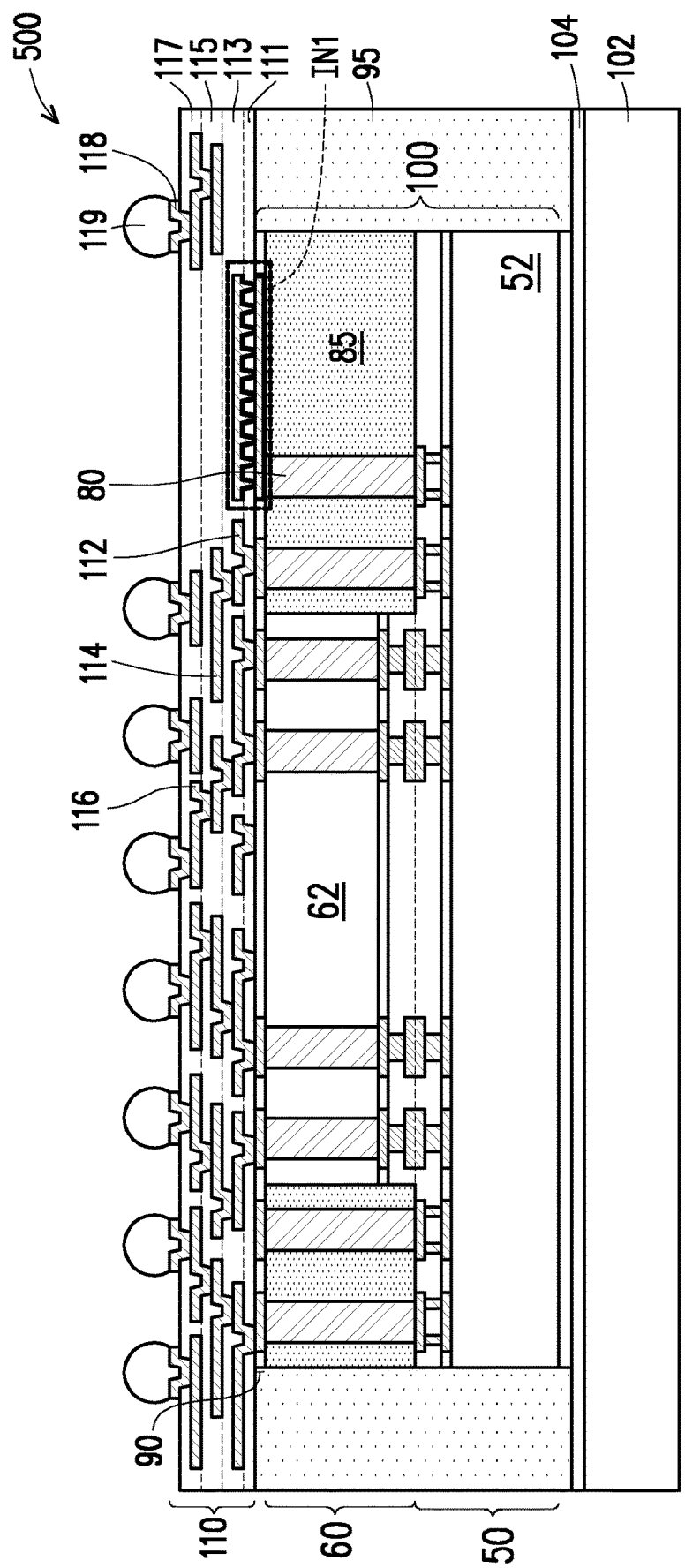
Figure 10A:
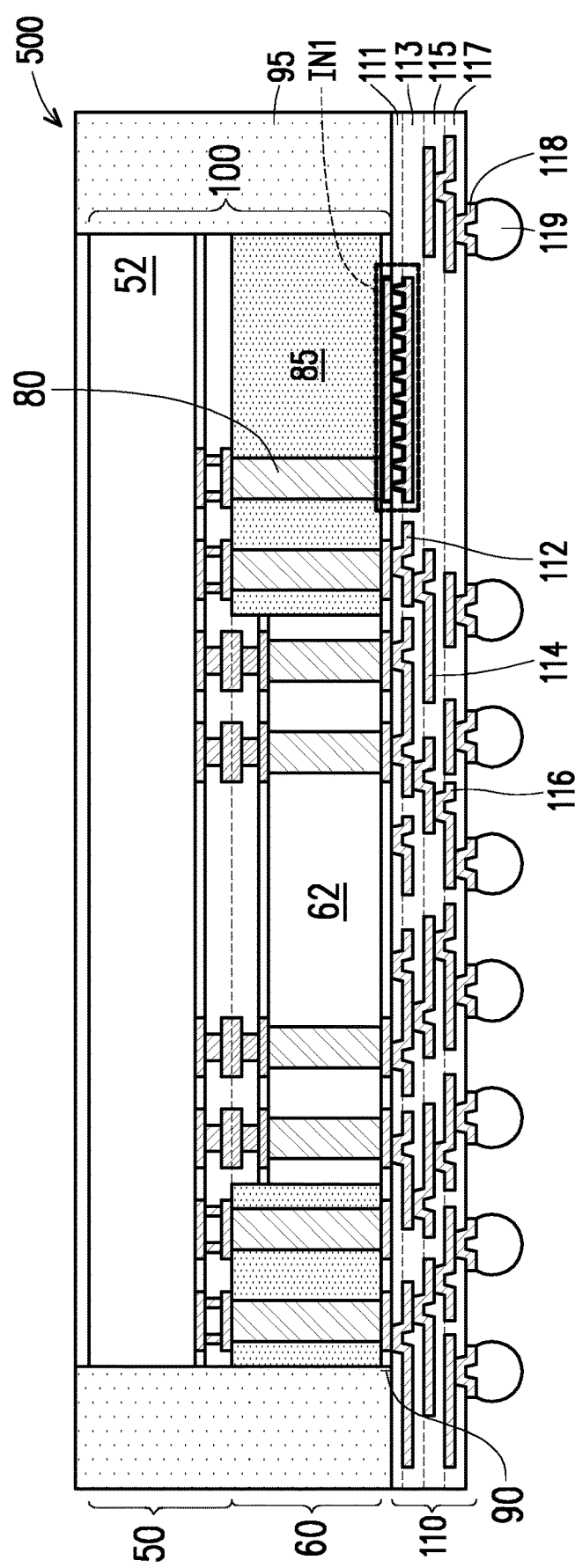

Referring to FIGS. 9 and 10A, a semiconductor package 500 with the inductor IN1 embedded inside is formed. As seen from the FIG. 9, under-bump metallurgy layers (UBMLs) 118 are formed for external connection to the redistribution structure 110. The UBMLs 118 have bump portions on and extending along the surface of the dielectric layer 117, and have via portions extending through the dielectric layer 117 to physically and electrically connect the metallization pattern 116. As a result, the UBMLs 118 are electrically coupled to the conductive pattern 92. The UBMLs 118 may be formed of the same material as the metallization pattern 112. In some embodiments, the UBMLs 118 have a different size than the metallization patterns 112, 114 and 116.

In some embodiments, conductive connectors 119 are formed on the UBMLs 118. The conductive connectors 119 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 119 may include a conductive material such as solder, copper, aluminum, gold, nickel, silver, palladium, tin, the like, or a combination thereof. In some embodiments, the conductive connectors 119 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 119 comprise metal pillars (such as a copper pillar) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 10B:
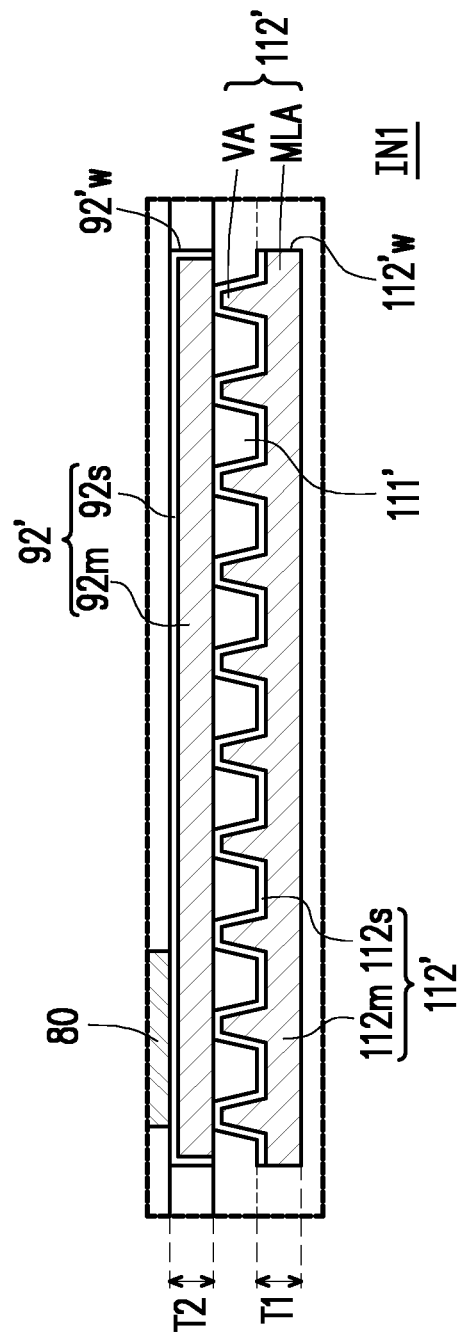
FIG. 10B is an enlarged view of an inductor illustrated in the FIG. 10A.

In FIG. 10A, a de-bonding process is performed to release the carrier substrate 102 from the overlying structure, such that a surface of the semiconductor package 500 is exposed. In some embodiments, after the de-bonding of the carrier substrate 102, the surface of the semiconductor package 500 may be cleaned and the semiconductor package 500 may be turned upside down for further processing, as shown in the FIG. 10A. FIG. 10B is an enlarged view of the inductor IN1 illustrated in the FIG. 10A.

Still referring to FIG. 10A and FIG. 10B, the inductor IN1 is embedded in the semiconductor package 500, and electrically coupled to the die stack structure 100. A projection of the inductor IN1 is overlapped with a projection of the die stack structure 100. In some embodiments, the projection of the inductor IN1 is overlapped with a projection of the first integrated circuit die 50, and the projection of the inductor IN1 is separated from projection of the second integrated circuit die 60. In some embodiments, the inductor IN1 is separated from the first integrated circuit die 50 by the dielectric layer 85 and electrically coupled to the first integrated circuit die 50 through one of the through vias 80. The inductor IN1 and the second integrated circuit die 60 are separated by the inter-metal dielectric layer 91 of the backside interconnect structure 90.

A conductive wire wrapping around a portion of dielectric material is defined to from the inductor IN1. The conductive wire of the inductor IN1 may include a portion of the conductive pattern 92' of the interconnect structure 90 and a portion of the metallization pattern 112' of the redistribution structure 110, and the dielectric material wrapped by the conductive wire of the inductor IN1 may include a portion of the dielectric layer 111' of the redistribution structure 110. In other words, the inductor IN1 may include the portion of the conductive pattern 92' and the portion of metallization pattern 112' adjacent to the portion of the conductive pattern 92'. That is, the inductor IN1 may be embedded in the back-side interconnect structure 90 and the redistribution structure 110.

In some embodiments, the die stack structure 100 and the redistribution structure 110 respectively includes a wire fragment of the conductive wire feature of the inductor IN1. For example, the conductive wire of the inductor IN1 may include a first wire fragment and a second wire fragment, and the portion of the conductive pattern 92' may be referred to as the first wire fragment of the inductor IN1, the portion of the metallization pattern 112' may be referred to as the second wire fragment of the inductor IN1.

As illustrated in FIG. 10A and FIG. 10B, the inductor IN1 includes a portion of the conductive pattern 92', and a portion of the metallization pattern 112'. The portion of the metallization pattern 112' may include a metal line MLA and a plurality of conductive vias VA extending through the portion of the dielectric layer 111', and the plurality of conductive vias VA may physically and electrically connects the metal line MLA and the portions of the conductive pattern 92'. As shown in FIG. 10B, the portion of the conductive pattern 92' may comprise a seed layer 92s and a metallic layer 92m formed over the seed layer 92s; the portion of the metallization pattern 112' may comprise a seed layer 112s and a metallic layer 112m formed over the seed layer 112s. In some embodiments, the seed layer 92s and the seed layer 112s are conformal layers.

Still referring to FIG. 10A and FIG. 10B, it is illustrated that the portion of the conductive pattern 92' is substantially aligned with the portion of the metallization pattern 112'. That is, a sidewall 92'w of the portion of the conductive pattern 92' is substantially aligned with a sidewall 112'w of the metal line MLA. In some embodiments, the plurality of conductive vias VA and the metal line MLA of the metallization pattern 112' may be formed simultaneously. In some embodiments, a thickness T1 of the metal line MLA may be greater than a thickness T2 of the portion of the conductive pattern 92'. In some particular embodiments, the thickness T1 of the metal line MLA may range from 5 µm to 7 µm.

It should be noted that, while in FIG. 10A and FIG. 10B the semiconductor package 500 is illustrated to include one inductor IN1, the disclosure is not limited thereto. In some alternative embodiments, one or more of the inductors IN1 may be included in the semiconductor package 500 based on the design requirements. In some embodiments, a conductive material of the inductor IN1 is formed to include the portion of the metallization pattern 112' of the redistribution structure 110 and the portion of the conductive pattern 92' of the die stack structure 100 which allows for thicker conductors of the inductor IN1, which then enables to increase performance (e.g., higher Q factor) for the inductor IN1.

Figure 11A:
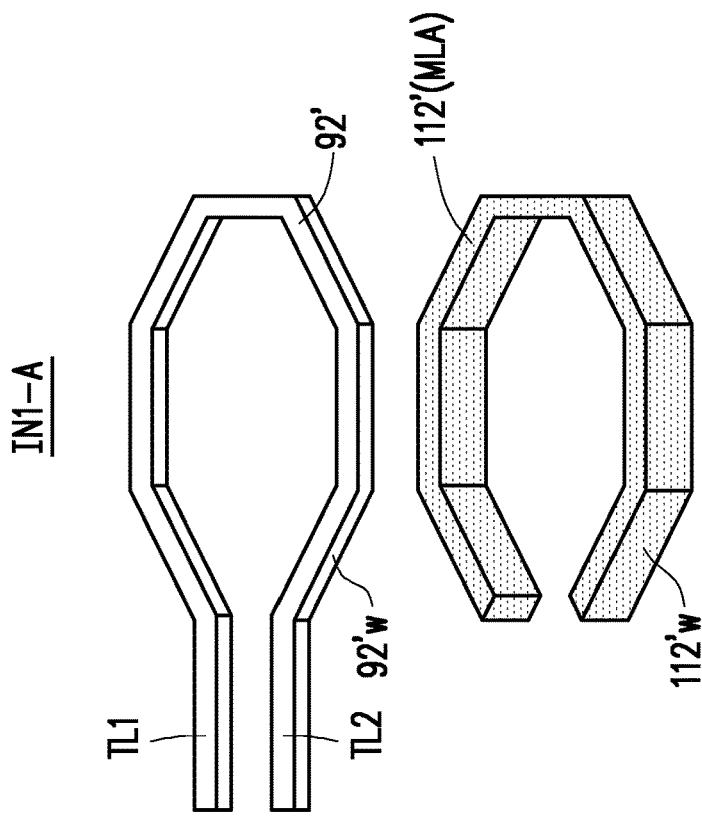
FIG. 11A through FIG. 11C are schematic perspective views illustrating various structures of the inductor embedded in the semiconductor packages shown in FIGS. 10A-10B in accordance with some embodiments of the disclosure.
Figure 11B:
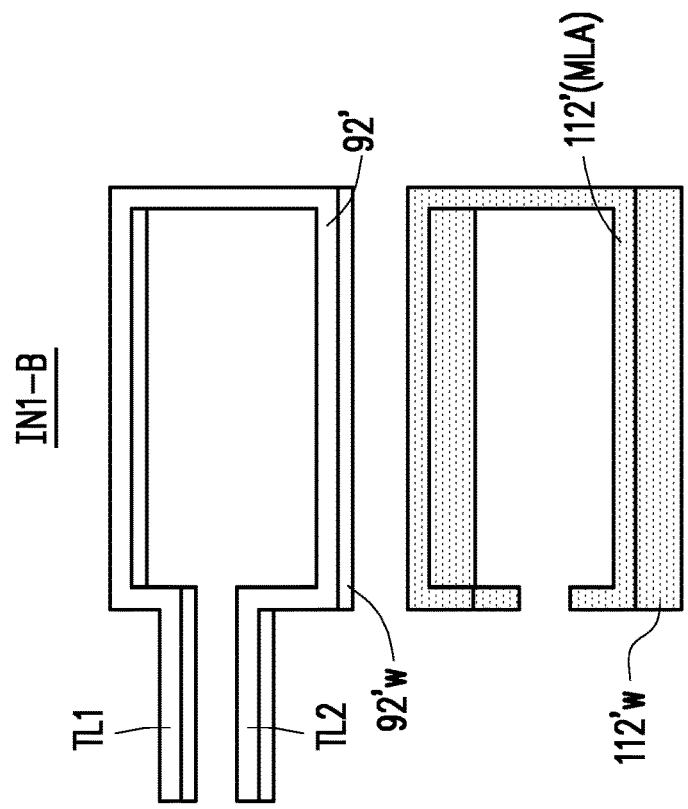
Figure 11C:
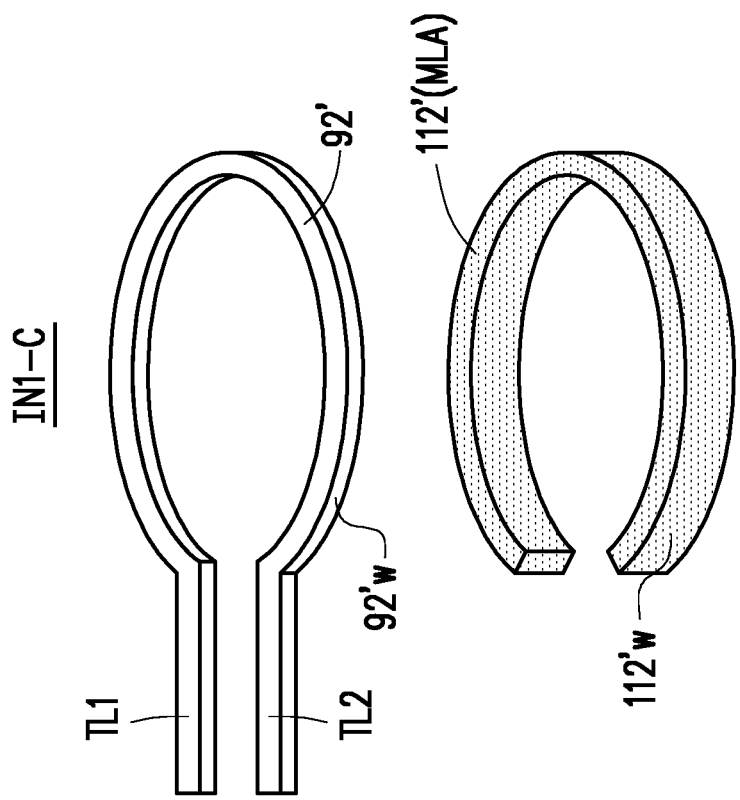

FIG. 11A through FIG. 11C are schematic perspective views illustrating various structures of the inductor IN1 embedded in the semiconductor packages shown in FIG. 10A and FIG. 10B in accordance with some embodiments of the disclosure. It is noted that the conductive wire of the inductor IN1 is illustrated in FIG. 11A through FIG. 11C while the dielectric layer 111' and the plurality of conductive vias VA within the dielectric material are omitted in FIG. 11A through FIG. 11C for simplicity.

As seen from FIG. 11A through FIG. 11C, three exemplary perspective views of the inductor IN1 with different shapes of conductive wire are shown. In FIG. 11A through FIG. 11C, each of the wire fragments, such as the metal line MLA and the portion of the conductive pattern 92' are overlapped with each other. The metal line MLA and the portion of the conductive pattern 92' respectively form a partially enclosed conductive wire of inductors IN1-A, IN1-B and IN1-C in accordance with the illustrated embodiments shown in FIG. 11A through FIG. 11C. In some embodiments, the partially enclosed conductive wire includes two terminal portions TL1 and TL2 extending from the portion of the conductive pattern 92'. In some alternative embodiments, the partially enclosed conductive wire has a shape that includes a major part of an octagon (see FIG. 11A), a major part of a rectangle or square (see FIG. 11B) and a major part of a circle (see FIG. 11C). The conductive wire is partially enclosed since there is a gap between the two terminal portions TL1 and TL2, and due to the gap, the top view of the shape of the conductive wire is not a complete shape (e.g., octagon, rectangle, square or circle), hence only includes a major part of a corresponding shape (e.g., octagon, rectangle, square or circle). In some embodiments, the terminal portion TL1 and the terminal portion TL2 may be electrically coupled to one of the through vias 80.

Figure 12A:
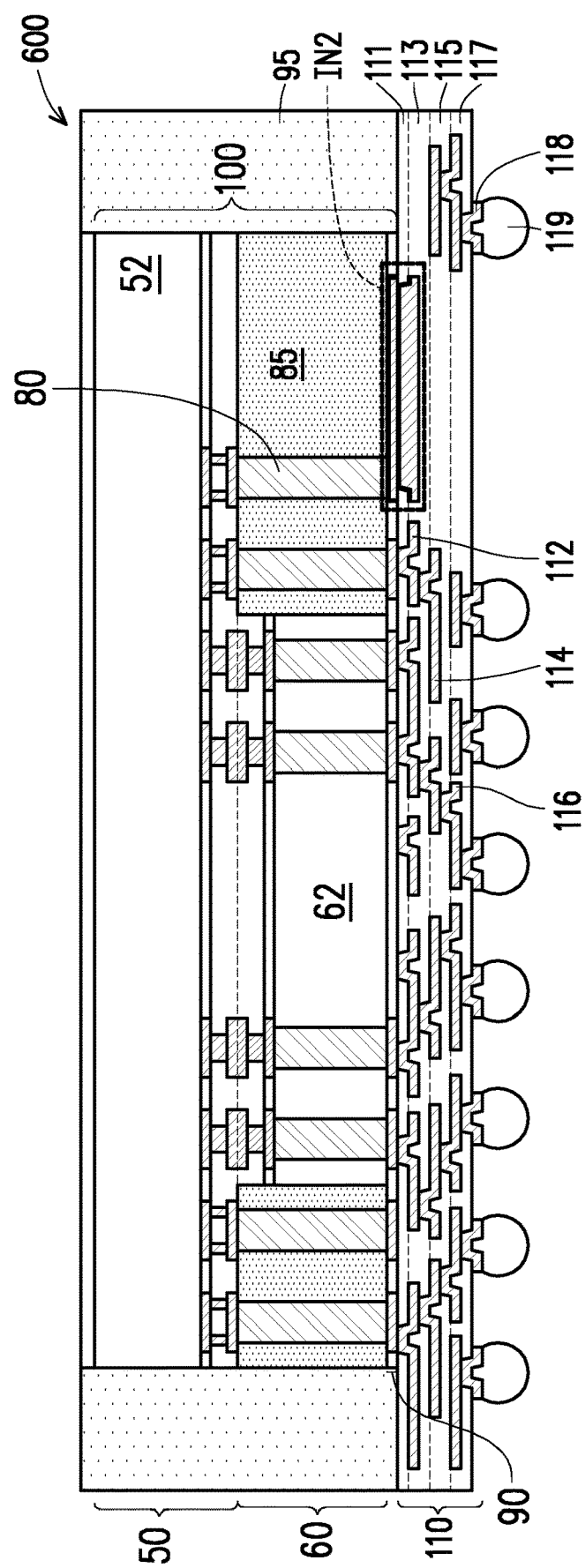
FIG. 12A is a schematic cross-sectional view illustrating another semiconductor package having an inductor in accordance with some embodiments of the disclosure.
Figure 12B:
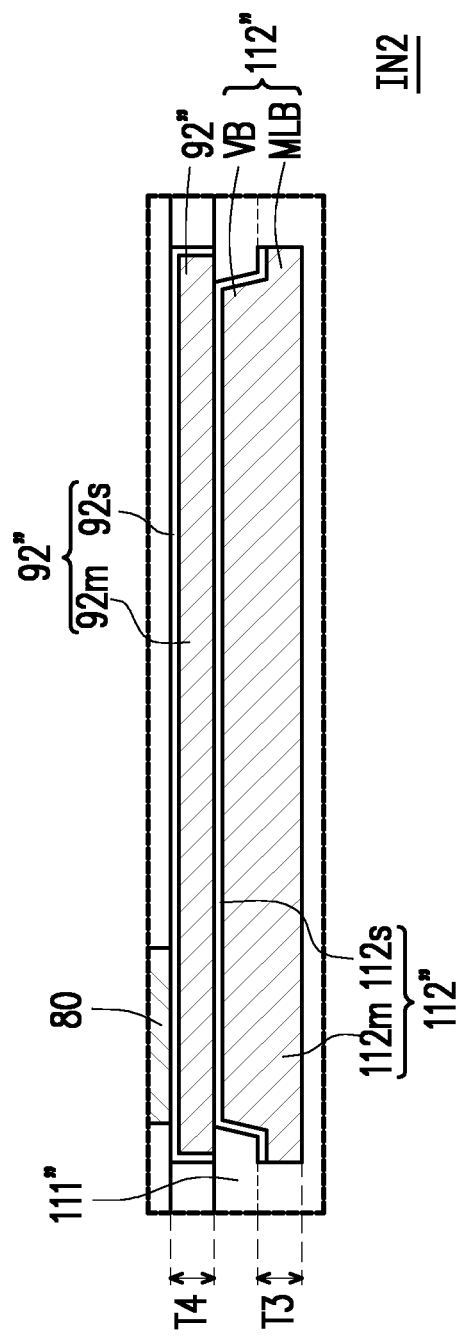
FIG. 12B is an enlarged view of an inductor illustrated in the FIG. 12A.

FIG. 12A is a schematic cross-sectional view illustrating another semiconductor package 600 having an inductor IN2 in accordance with some embodiments of the disclosure. FIG. 12B is an enlarged view of an inductor illustrated in the FIG. 12A. In some embodiments, the semiconductor package 600 is similar to the semiconductor package 500 illustrated in FIG. 10A, with similar features being labeled by similar numerical reference, and the detailed descriptions of the similar features are not repeated herein. In some embodiments, the semiconductor package 600 may be formed using process steps described above with reference to FIG. 1 through FIG. 10A, and the description is not repeated herein.

Referring to FIG. 12A and FIG. 12B, the inductor IN2 of the semiconductor package 600 is similar to the inductor IN1 of the semiconductor package 500, with the distinction that a conductive wall VB formed between wire fragments within process variations. In the illustrated embodiment, the conductive wire of the inductor IN2 may include a portion of the conductive pattern 92" of the interconnect structure 90 and a portion of the metallization pattern 112" of the redistribution structure 110, and the dielectric material wrapped by the conductive wire of the inductor IN2 may include a portion of the dielectric layer 111" of the redistribution structure 110. In other words, the inductor IN2 may include the portion of the conductive pattern 92" and the portion of metallization pattern 112" adjacent to the portion of the conductive pattern 92". That is, the inductor IN2 may be embedded in the back-side interconnect structure 90 and the redistribution structure 110. In the illustrated embodiment, a projection of the inductor IN2 is overlapped with a projection of the first integrated circuit die 50.

Referring to FIG. 12B, the portion of the metallization pattern 112" includes a metal line MLB and the conductive wall VB extending through the portion of the dielectric layer 111". In some embodiments, a surface area of the conductive wall VB is larger than a respective surface area of the respective conductive vias VA shown in FIG. 10B. The surface areas here are respectively referred to the surface area of the interface between the portion of the conductive pattern 92" and the portion of the metallization pattern 112" (see FIG. 12B) or the surface area of the interface between the portion of the conductive pattern 92' and the portion of the metallization pattern 112' (see FIG. 10B). As shown in FIG. 12B, the portion of the conductive pattern 92" may comprise a seed layer 92s and a metallic layer 92m formed over the seed layer 92s; the portion of the metallization pattern 112" may comprise a seed layer 112s and a metallic layer 112m formed over the seed layer 112s. In some embodiments, the seed layer 92s and the seed layer 112s are conformal layers.

Still referring to FIG. 12 and FIG. 12B, the conductive wall VB physically and electrically connects the portion of the conductive pattern 92" and the portion of the metallization pattern 112". In some other embodiments, the inductor IN2 of the semiconductor package 600 is similar to the inductor IN1 of the semiconductor package 500 in that a thickness T3 of the metal line MLB is greater than a thickness T4 of the portion of the conductive pattern 92". In some particular embodiments, the thickness T3 of the metal line MLB may range from 5 μm to 7 μm. It should be noted that, while in FIG. 12A and FIG. 12B the semiconductor package 600 is illustrated to include one inductor IN2, the disclosure is not limited thereto. In some alternative embodiments, one or more of the inductors IN2 may be included in the semiconductor package 600 based on the design requirements.

FIG. 13 to FIG. 17 are schematic cross-sectional views illustrating intermediate steps during a process for forming yet another semiconductor package having a 3D solenoid inductor in accordance with some embodiments of the disclosure.

Figure 13:
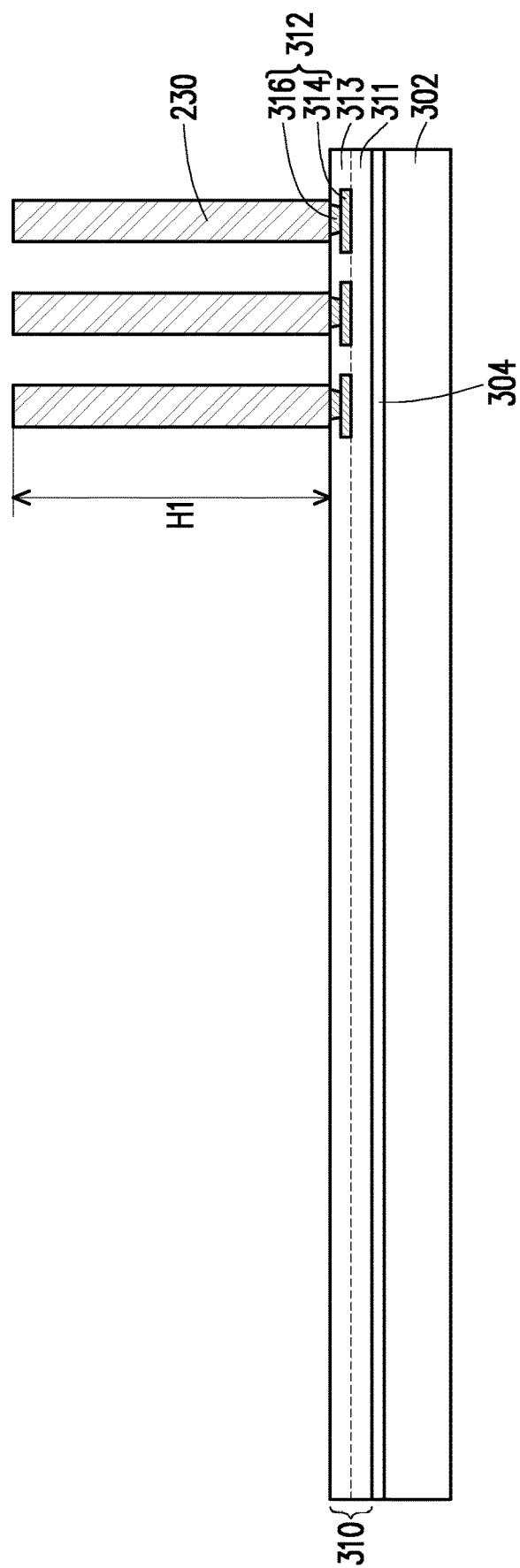
FIG. 13 through FIG. 18 are schematic cross-sectional views illustrating intermediate steps during a process for forming yet another semiconductor package having a 3D solenoid inductor in accordance with some embodiments of the disclosure.

Referring to FIG. 13, a carrier substrate 302 is provided, and a release layer 304 is formed on the carrier substrate 302. In some embodiments, the carrier substrate 302 and the release layer 304 thereon may be similar to may be similar to the carrier substrate 102 and the release layer 104 described in FIG. 1. As illustrated in FIG. 13, a first redistribution structure 310 is formed over the carrier substrate 302. In some embodiments, the first redistribution structure 310 may include more or fewer dielectric layers 311 and 313, metallization pattern 312 than illustrated in FIG. 13, according to the routing requirements. In some embodiments, the metallization pattern 312 may comprise metal lines 314 and vias 316. In some embodiments, the metallization pattern 312 may comprise a seed layer and a metallic layer over the seed layer. In the illustrated embodiment, the vias 316 of the metallization pattern 312 may be used for the electrical connection between the metal lines 314 and conductive pillars 230 which are subsequently formed.

As illustrated in FIG. 13, conductive pillars 230 are formed over the first redistribution structure 310. In the illustrated embodiment, the conductive pillars 230 will extend through the subsequently formed encapsulant 235 (see FIG. 15). As an example to form the conductive pillars 230, a seed layer (not shown) is formed over the dielectric layer 313 and the metallization pattern 312. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to the conductive pillars 230. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, such as copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the conductive pillars 230. In some embodiments, a height H1 of each of the conductive pillars 230 may be greater than or substantially equal to a height H2 of the die stack structure 200 subsequently attached on the first redistribution structure 310.

Figure 14:
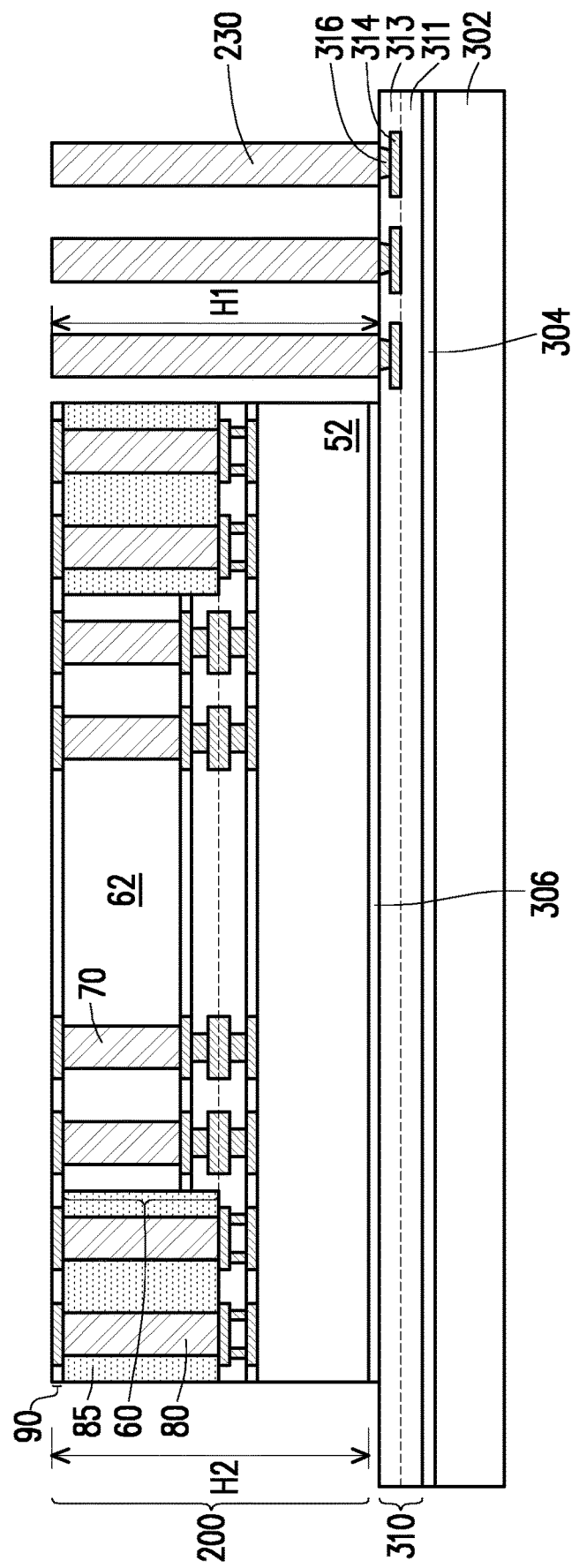

In FIG. 14, a die stack structure 200 is attached to the first redistribution structure 310 aside the conductive pillars 230 by an adhesion layer 306. In some embodiments, the die stack structure 200 may be similar to the die stack structure 100 with similar features being labeled by similar numerical reference, and the detailed descriptions of the similar features are not repeated herein. In some embodiments, the die stack structure 200 may be formed using process steps described above with reference to FIG. 1 to FIG. 5, and the description is not repeated herein.

Optionally, the adhesion layer 306 may be on back-side of the die stack structure 200 in order to adhere the die stack structure 200 to the over the surface of the carrier substrate 302, such as over the first redistribution structure 310. The adhesion layer 306 may be any suitable adhesive, epoxy, die attach film (DAF), or the like. The adhesion layer 306 may be applied to back-side of the die stack structure 200 or over the surface of the carrier substrate 302 (e.g., over the first redistribution structure 310).

Figure 15:
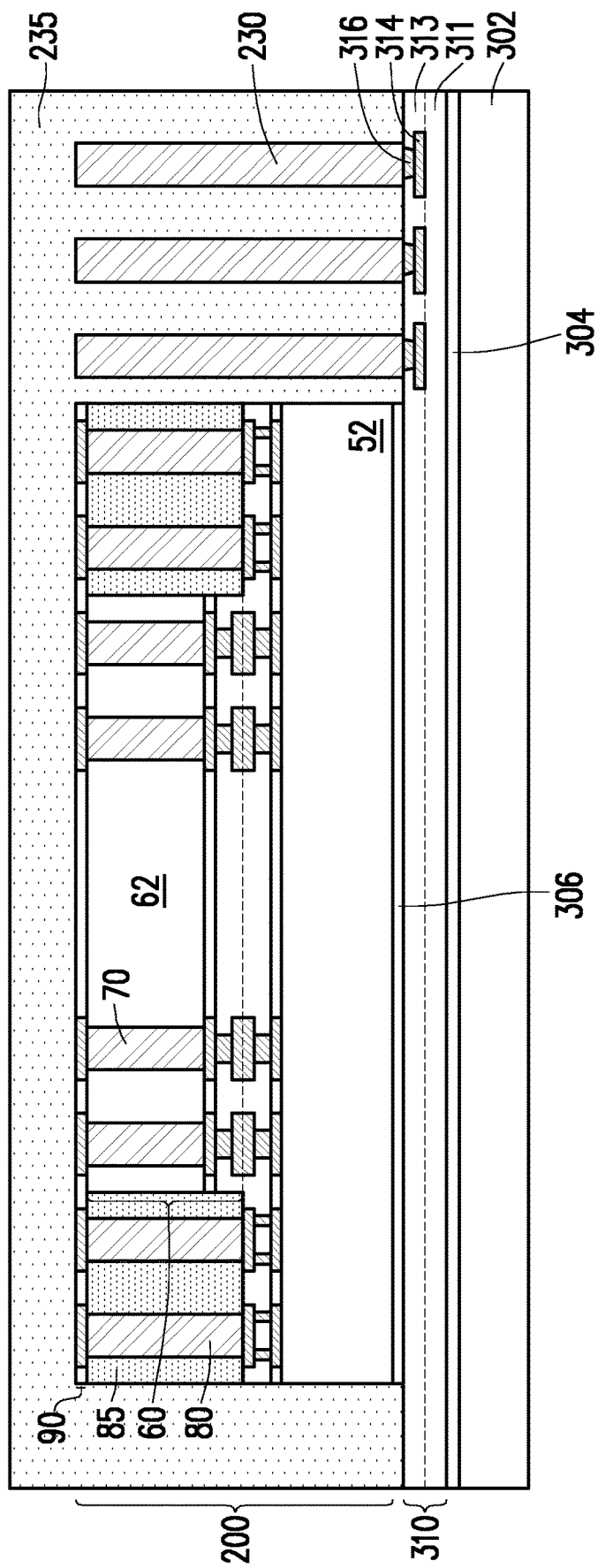

Referring to FIG. 15, the die stack structure 200 and the conductive pillars 230 over the package substrate 300 is molded and encapsulated in the encapsulant 235. In some embodiments, the encapsulant 235 covers and laterally surrounds the die stack structure 200. In some embodiments, the material of the encapsulant 235 includes epoxy resins, phenolic resins or silicon-containing resins. In some other embodiments, the material of the encapsulant 235 includes filler particles.

In some embodiments, the encapsulant 235 is overmolded and then planarized to expose the back-side interconnect structure 90 of the die stack structure 200 and the conductive pillars 230. In some embodiments, after the planarization, a surface of the back-side interconnect structure 90, surfaces of the conductive pillars 230 and a surface of the encapsulant 235 are substantially coplanar. In some embodiments, the encapsulant 235 is planarized through a grinding process or a CMP process.

Figure 16:
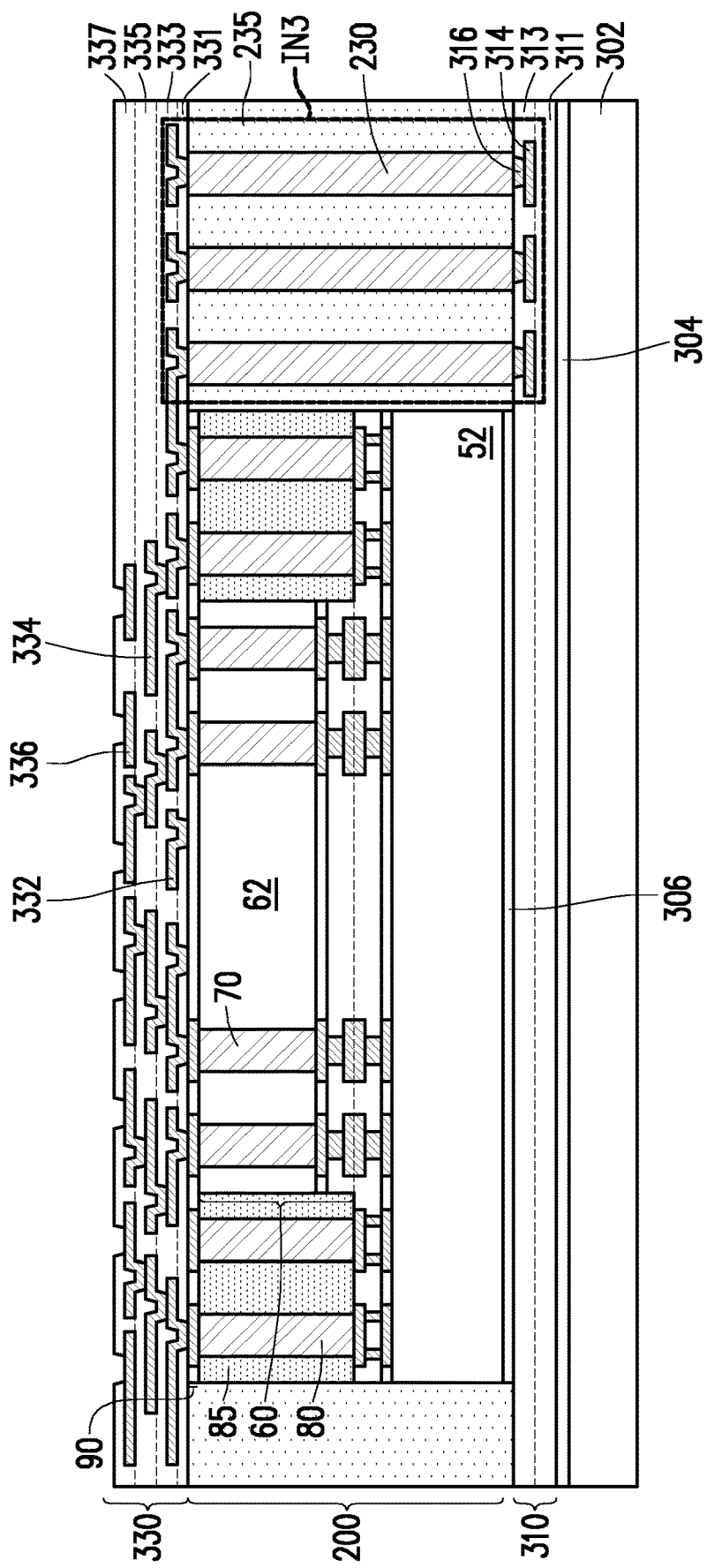

Referring to FIG. 16, a second redistribution structure 330 is formed over the die stack structure 200, the conductive pillars 230 and the encapsulant 235. The second redistribution structure 330 includes dielectric layers 331, 333, 335, and 337; and metallization patterns 332, 334, and 336. The metallization patterns may also be referred to as redistribution layers or redistribution lines. The second redistribution structure 330 is shown as an example having three layers of metallization patterns. More or fewer dielectric layers and metallization patterns may be formed in the second redistribution structure 330. If fewer dielectric layers and metallization patterns are to be formed, steps and process discussed below may be omitted. If more dielectric layers and metallization patterns are to be formed, steps and processes discussed below may be repeated. In some embodiments, the dielectric layers 331, 333, 335, and 337 may be formed in a manner similar to the dielectric layers 111, 113, 115, 117 and may be formed of a similar material as the dielectric layers 111, 113, 115, 117, as shown in FIG. 8. In some embodiments, the metallization patterns 332, 334, and 336 may be formed in a manner similar to the metallization patterns 112, 114, 116 and may be formed of a similar material as the metallization patterns 112, 114, 116, as shown in FIG. 8.

In the embodiment shown, the metallization pattern 336 is the topmost metallization pattern of the second redistribution structure 330. As such, all of the intermediate metallization patterns of the second redistribution structure 330 (e.g., the metallization patterns 332 and 334) are disposed between the metallization pattern 336 and the die stack structure 200. In some embodiments, the metallization pattern 336 has a different size than the metallization patterns 332 and 334. For example, the conductive lines and/or vias of the metallization pattern 336 may be wider or thicker than the conductive lines and/or vias of the metallization patterns 332 and 334. Further, the metallization pattern 336 may be formed to a greater pitch than the metallization pattern 334.

As discussed above, additional dielectric layers and metallization patterns may be included in the second redistribution structure 330 by repeating steps described above. If fewer dielectric layers and metallization patterns are desired in the second redistribution structure 330, then steps described above may be omitted.

Figure 17:
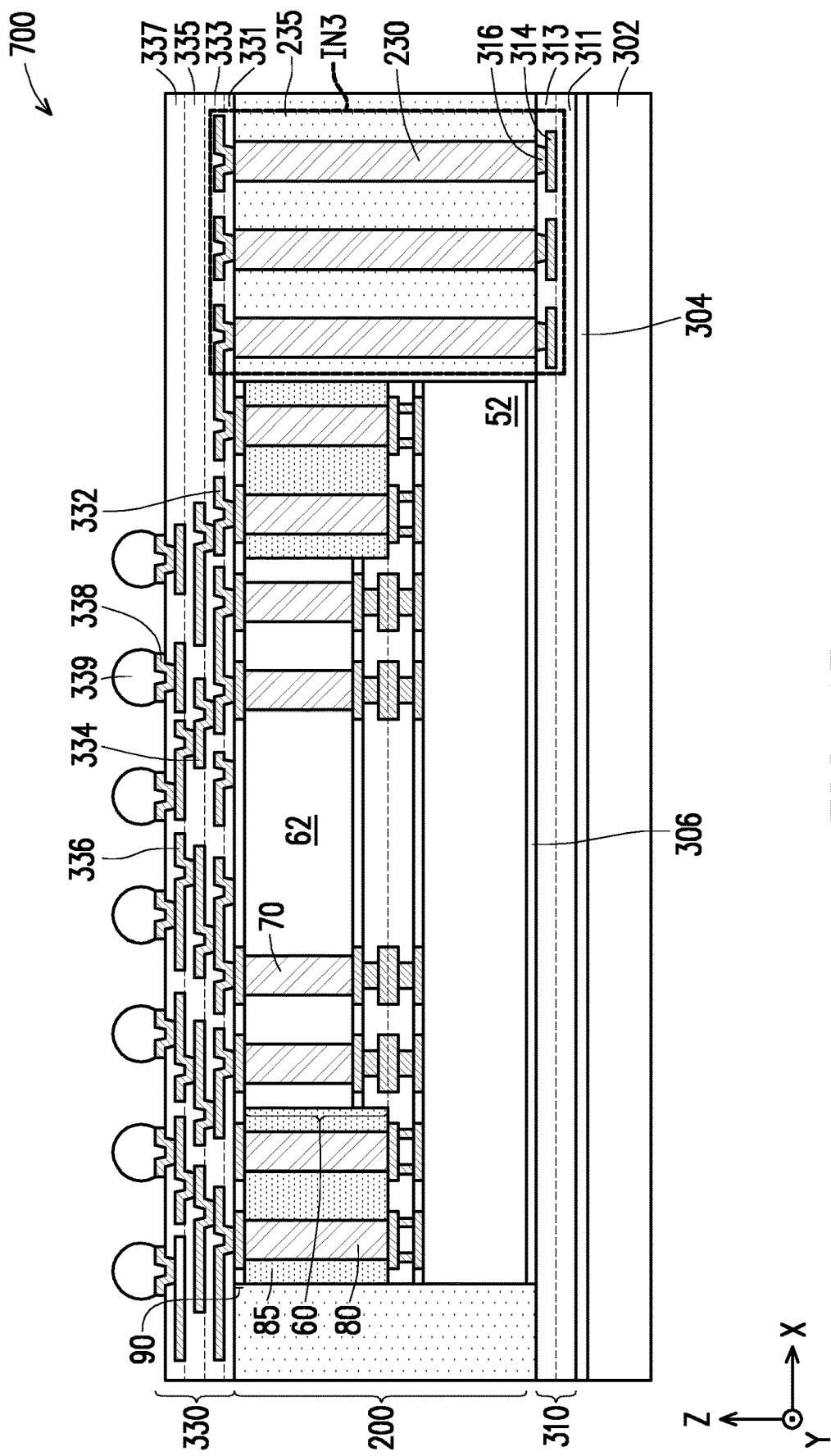

As seen from the FIG. 17, under-bump metallurgy layers (UBMLs) 338 and conductive connectors 339 are formed for external connection to the second redistribution structure 330. The UBMLs 338 and the conductive connectors 339 may respectively be formed in a manner similar to the UBMLs 118 and the conductive connectors 119. In some embodiments, a material of the UBMLs 338 and a material of the conductive connectors 339 may be similar to the material of the UBMLs 118 and the material of the conductive connectors 119, respectively.

Figure 18:
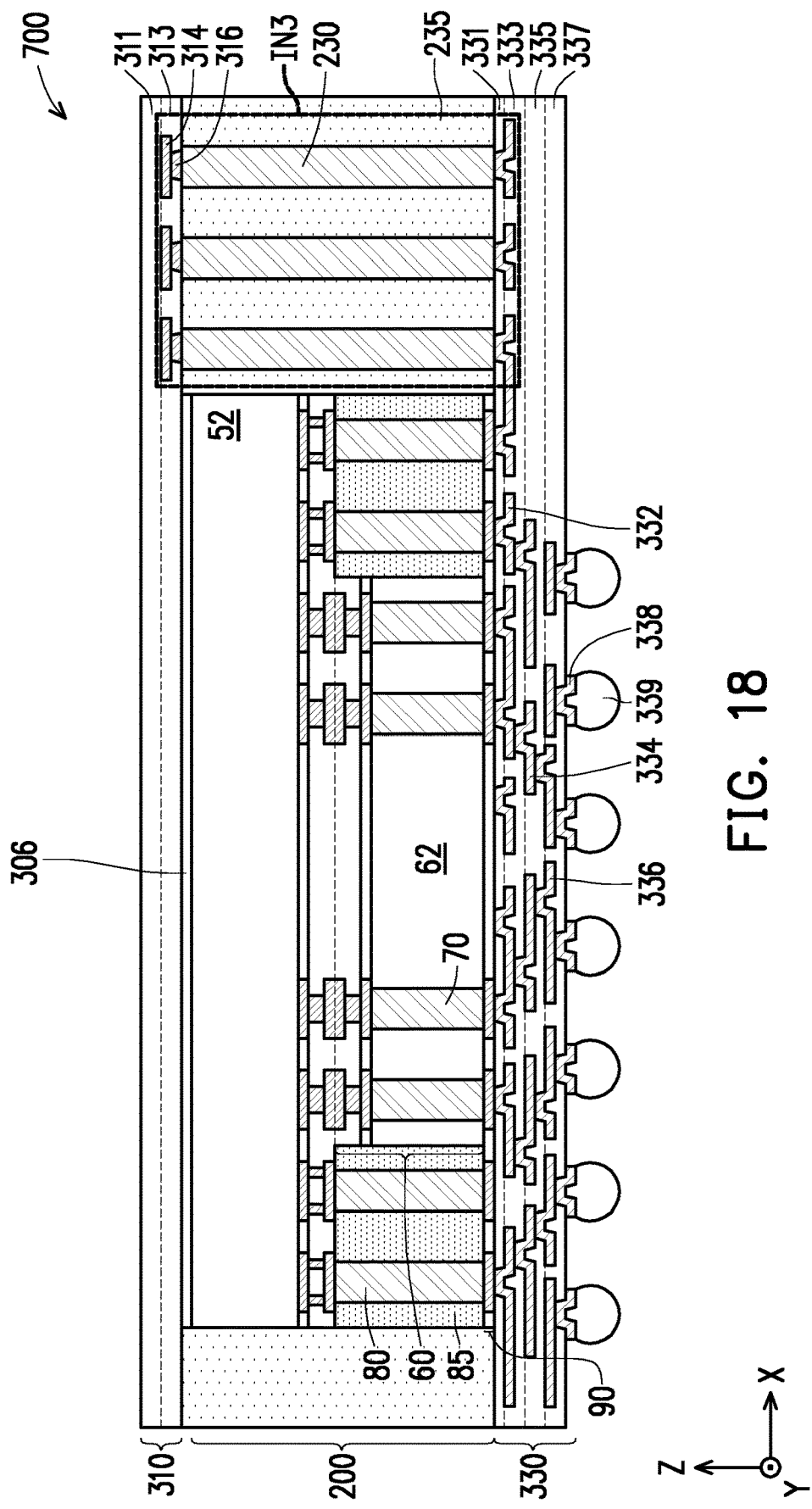

Referring to FIG. 18, a de-bonding process is performed to release the carrier substrate 302 from the overlying structure, such that a surface of the semiconductor package 700 is exposed. In some embodiments, after the de-bonding of the carrier substrate 302, the surface of the semiconductor package 700 may be cleaned and the semiconductor package 700 may be turned upside down for further processing, as shown in the FIG. 18.

Figure 19:
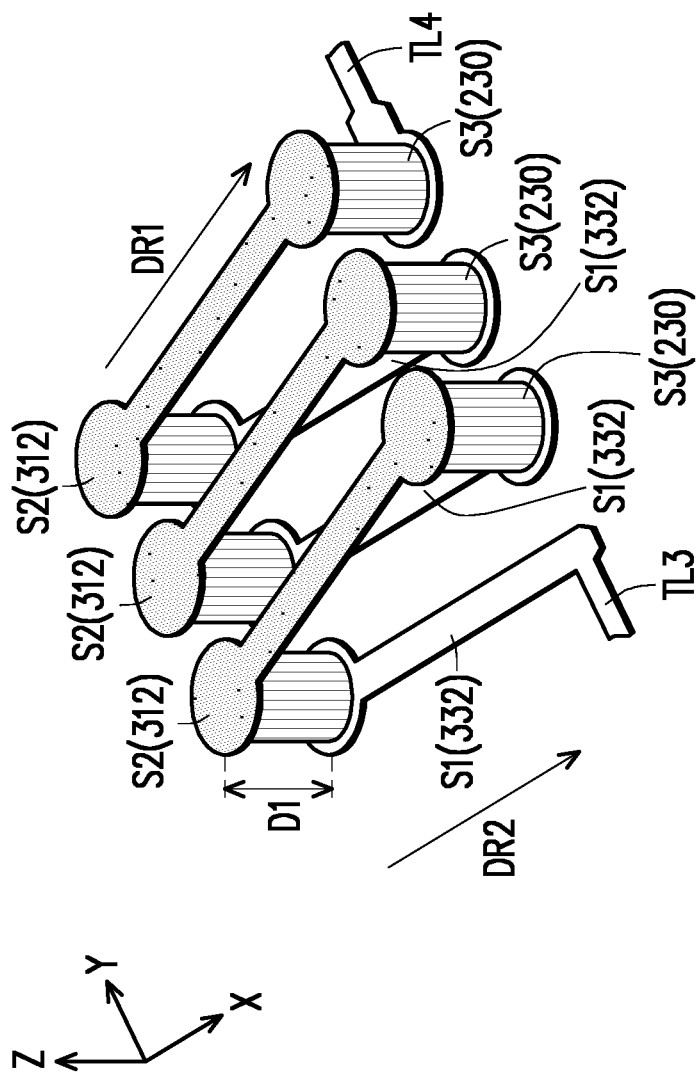
FIG. 19 is a schematic perspective view illustrating the 3D solenoid inductor embedded in the semiconductor package shown in FIG. 18 in accordance with some embodiments of the disclosure.

FIG. 19 is a schematic perspective view illustrating the 3D solenoid inductor embedded in the semiconductor package shown in FIG. 18 in accordance with some embodiments of the disclosure. Referring to FIG. 18 and FIG. 19, a 3D solenoid inductor IN3 is embedded in the semiconductor package 700. In some embodiments, the 3D solenoid inductor IN3 may include portions of the metallization pattern 332, the conductive pillars 230 and portions of the metallization pattern 312. As shown in the FIG. 18 and FIG. 19, the portions of the metallization pattern 332 and the portions of the metallization pattern 312 are respectively adjacent to the conductive pillars 230. In other words, the 3D solenoid inductor IN3 may be embedded in the first redistribution structure 310, the second redistribution structure 330 and the encapsulant 235 therebetween. In the illustrated embodiment, a projection of the inductor IN3 is located outside a projection of the die stack 200.

As perspective view of the 3D solenoid inductor IN3 shown in FIG. 19, the portions of the metallization pattern 332 of the second redistribution structure 330 may be referred to as first segments S1, the portions of the metallization pattern 312 of the first redistribution layer 310 may be referred to as second segments S2, and the TIVs 230 may be referred to as third segments S3 connecting the first segments S1 and the second segments S2. As illustrated in FIG. 19, the first segments S1 and the second segments S2 are respectively located in different level heights with a distance D1 spacing apart. In some embodiments, the distance D1 may be greater than the height H2 of the die stack structure 200.

In some alternative embodiments, each of the first segments S1 extends along a surface of the dielectric layer 331 and extends along a first direction DR1, and each of the second segments S2 extends along a surface of the dielectric layer 313 and extends along a second direction DR2. In some embodiments, the first direction DR1 and the second segments S2 are different. In some other embodiments, an angle is between the first direction DR1 and the second direction DR2. Further in some embodiments, an arrangement of the first segments S1 and an arrangement of the second segments S2 are respectively in a parallel manner. In some embodiments, each of the third segments S3 is substantially perpendicular to the first segments S1 and the second segments S2. In some embodiments, the third segments S3 physically and electrically connects the first segments S1 and the second segments S2, and each of the third segments S3 are arranged to be parallel to one another.

Still referring to FIG. 18 and FIG. 19, the 3D solenoid inductor IN3 includes a first terminal portion TL3 and a second terminal portion TL4. In some embodiments, the first terminal portion TL3 is coupled to the die stack structure 200, while the second terminal portion TL4 is grounded. In alternative embodiments, the first terminal portion TL3 is coupled to the die stack structure 200, while the second terminal portion TL4 is coupled to the other die stack structure. The first terminal portion TL3 and the second terminal portion TL4 may be two of the first segments S1 of the 3D solenoid inductor IN3. In some embodiments, two of the first segments S1 at the outer sides of the 3D solenoid inductor IN3 are served as the first terminal portion TL3 and the second terminal portion TL4, such that the 3D solenoid inductor IN3 is electrically coupled to the die stack structure 200. It should be noted that, while in FIG. 17 and FIG. 18 the semiconductor package 700 is illustrated to include one 3D solenoid inductor IN3, the disclosure is not limited thereto. In some alternative embodiments, one or more of the 3D solenoid inductors IN3 may be included in a semiconductor package based on the design requirements.

In accordance with some embodiments of the disclosure, a semiconductor package includes a first die and a second die. The second die is bonded to the first die. An encapsulant laterally encapsulates the second die. Through vias are disposed in the encapsulant and extend through the encapsulant. An interconnect structure is disposed on the second die, the through vias and the encapsulant. A redistribution structure is disposed on the interconnect structure. An inductor is embedded in the redistribution structure and the interconnect structure.

In accordance with some embodiments of the disclosure, a semiconductor package includes a die stack structure. The die stack structure includes a first die and a second die, and the first die stacks over the second die. A first encapsulant is over the second die and laterally encapsulates the first die to form a die stack structure. A second encapsulant laterally encapsulates the die stack structure and conductive pillars are disposed in the second encapsulant. A first redistribution structure is disposed on a first side of the die stack structure, the conductive pillars and the second encapsulant, and a second redistribution structure is disposed on a second side of the die stack structure, the conductive pillars and the second encapsulant. A solenoid inductor is embedded in the first redistribution structure, the second redistribution structure and the second encapsulant therebetween.

In accordance with some embodiments of the disclosure, a method of manufacturing a semiconductor package includes at least the following steps. A first die and a second die are provided, and the second die is bonded to a first die. A first encapsulant is formed to encapsulate the second die, and a plurality of through vias are formed in the first encapsulant. An interconnect structure is formed on the second die, the plurality of through vias and the encapsulant such that a die stack structure is formed. A second encapsulant is formed to laterally encapsulate the die stack structure. A redistribution structure is formed over the die stack structure and the second encapsulant. An inductor is formed in the interconnect structure and the redistribution structure, wherein the inductor comprises a portion of the interconnect structure and a portion of the redistribution structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
   a first die;
   a second die bonded to the first die, wherein the second die includes a substrate having an active surface and a surface opposite to the active surface;
   a first encapsulant laterally encapsulating the second die;
   through vias disposed in the first encapsulant;
   an interconnect structure disposed on the second die, the through vias and the first encapsulant;
   a redistribution structure disposed on the interconnect structure;
   an inductor embedded in the redistribution structure and the interconnect structure, wherein the inductor comprises a portion of a conductive pattern of the interconnect structure, the portion of the conductive pattern of the interconnect structure is in direct contact with one of the through vias, and the portion of the conductive pattern of the interconnect structure is located outside of a span of the second die; and
   a second encapsulant laterally encapsulating the first die and the first encapsulant,
   wherein the redistribution structure is further disposed on the second encapsulant, and the first die and the second die are surrounded by the redistribution structure, the interconnect structure and the second encapsulant,
   wherein the second die, the first encapsulant, the through vias and the interconnect structure are sandwich between the first die and the redistribution structure,
   wherein the through vias are in contact with the first die, a top surface of the second die is horizontally coplanar with top surfaces of the through vias, a bottom surface of the second die is horizontally coplanar with bottom surfaces of the through vias, the interconnect structure is in contact with the top surface of the second die, the first die is in contact with the bottom surface of the second die, the bottom surface of the second die is opposite to the top surface of the second die, the top surface of the second die includes the surface of the substrate of the second die, and a width of the interconnect structure is less than a width of the redistribution structure.

2. The semiconductor package of claim 1, wherein the inductor comprises a portion of a metallization pattern of the redistribution structure, and a sidewall of the interconnect structure is substantially aligned with a sidewall of the first encapsulant.

3. The semiconductor package of claim 2, wherein the portion of the metallization pattern of the inductor is adjacent to the portion of the conductive pattern of the inductor and the portion of the metallization pattern of the inductor and the portion of the conductive pattern of the inductor are overlapped with each other.

4. The semiconductor package of claim 1, wherein each of the bottom surfaces of the through vias is entirely coplanar with the bottom surface of the second die.

5. The semiconductor package of claim 2, wherein the portion of the metallization pattern of the inductor and the portion of the conductive pattern of the inductor are electrically connected to each other through a plurality of conductive vias therebetween.

6. The semiconductor package of claim 2, wherein the portion of the metallization pattern of the inductor and the portion of the conductive pattern of the inductor are electrically connected to each other through a conductive wall therebetween.

7. The semiconductor package of claim 2, wherein the portion of the metallization pattern of the inductor and the portion of the conductive pattern of the inductor are partially enclosed.

8. The semiconductor package of claim 2, wherein the portion of the metallization pattern of the inductor and the portion of the conductive pattern of the inductor form into a partially enclosed round shape, a partially enclosed rectangular shape, or a partially enclosed octagonal shape.

9. The semiconductor package of claim 2, wherein a thickness of the portion of the metallization pattern of the inductor is greater than a thickness of the portion of the conductive pattern of the inductor.

10. The semiconductor package of claim 2, wherein the first die comprises a first bonding structure and the second die comprises a second bonding structure, and the first bonding structure is in physical contact with the second bonding structure.

11. The semiconductor package of claim 10, wherein the portion of the conductive pattern of the inductor is electrically coupled to the first bonding structure of the first die through the one of the through vias.

12. A semiconductor package, comprising:
a die stack structure comprising an interconnect structure on a plurality of integrated circuit dies;
an encapsulant laterally encapsulating the plurality of integrated circuit dies and the interconnect structure of the die stack structure;
a redistribution structure disposed on the die stack structure and the encapsulant; and
an inductor embedded in the redistribution structure and the interconnect structure of the die stack structure, wherein the interconnect structure has a width less than a width of the redistribution structure,
wherein a portion of the inductor is laterally sandwiched between the encapsulant and a conductive pattern of the interconnect structure,
wherein the die stack structure further comprises first vias,
wherein a second die of the plurality of integrated circuit dies, the first vias and the interconnect structure are vertically sandwich between a first die of the plurality of integrated circuit dies and the redistribution structure,
wherein the second die of the plurality of integrated circuit dies includes a substrate having an active surface and a surface opposite to the active surface,
wherein the inductor comprises a portion of a conductive pattern of the interconnect structure, and the portion of the conductive pattern of the interconnect structure is in direct contact with one of the first vias, and the portion of the conductive pattern of the interconnect structure is located outside of a span of the second die of the plurality of integrated circuit dies,
wherein the first vias are in contact with the first die of the plurality of integrated circuit dies, a top surface of the second die of the plurality of integrated circuit dies is horizontally coplanar with top surfaces of the first vias, a bottom surface of the second die of the plurality of integrated circuit dies is horizontally coplanar with bottom surfaces of the first vias, the interconnect structure is in contact with the top surface of the second die of the plurality of integrated circuit dies, the first die of the plurality of integrated circuit dies is in contact with the bottom surface of the second die of the plurality of integrated circuit dies, the bottom surface of the second die of the plurality of integrated circuit dies is opposite to the top surface of the second die of the plurality of integrated circuit dies, the top surface of the second die of the plurality of integrated circuit dies includes the surface of the substrate of the second die of the plurality of integrated circuit dies.

13. The semiconductor package of claim 12, wherein a bottom surface of the inductor and a bottom surface of the interconnect structure are coplanar.

14. The semiconductor package of claim 13, wherein the die stack structure further comprises a dielectric layer laterally sandwiched between the second die of the plurality of integrated circuit dies and the encapsulant, and the bottom surface of the inductor is in contact with a top surface the dielectric layer.

15. The semiconductor package of claim 14, wherein the die stack structure further comprises a bonding structure between and electrically connecting the first die and the second die of the plurality of integrated circuit dies, and the dielectric layer is sandwiched between the bonding structure and the interconnect structure.

16. The semiconductor package of claim 15, wherein the one of the first vias extends through the dielectric layer to connect the inductor and the bonding structure, and the top surface of the second die of the plurality of integrated circuit dies, the top surfaces of the first vias and the top surface the dielectric layer are coplanar, and a bottom surface of the first vias and a bottom surface of dielectric layer are coplanar.

17. The semiconductor package of claim 16, wherein a height of each of the first vias is equal to a height of the second die of the plurality of integrated circuit dies.

18. A semiconductor package, comprising:
a die stack structure;
an encapsulant laterally encapsulating the die stack structure;
a redistribution structure disposed on the die stack structure and the encapsulant; and
an inductor comprising a first portion and a second portion connected to the first portion, wherein the first portion of the inductor is embedded in the die stack structure, and the second portion of the inductor is embedded in the redistribution structure,
wherein the die stack structure comprises a plurality of dies, an interconnect structure and through vias, and the encapsulant is in contact with sidewalls of one of the plurality of dies,
wherein a top die of the plurality of dies, the through vias and the first portion of the inductor are sandwich between a bottom die of the plurality of dies and the redistribution structure,
wherein the top die of the plurality of dies includes a substrate having an active surface and a surface opposite to the active surface,
wherein the first portion of the inductor is in direct contact with one of the through vias, and the first portion of the inductor is located outside of a span of the top die of the plurality of dies,
wherein the through vias are in contact with the bottom die of the plurality of dies, a top surface of the top die of the plurality of dies is horizontally coplanar with top surfaces of the through vias, a bottom surface of the top die of the plurality of dies is horizontally coplanar with bottom surfaces of the through vias, the interconnect structure is in contact with the top surface of the top die of the plurality of dies, the bottom die of the plurality of dies is in contact with the bottom surface of the top die of the plurality of dies, the bottom surface of the top die of the plurality of dies is opposite to the top surface of the top die of the plurality of dies, the top surface of the top die of the plurality of dies includes the surface of the substrate of the second die of the top die of the plurality of dies, and a width of the interconnect structure is less than a width of the redistribution structure.

19. The semiconductor package of claim 18, wherein the first portion of the inductor is laterally encapsulated by the encapsulant.

20. The semiconductor package of claim 18, further comprises an adhesion layer adhered to the die stack structure, wherein a bottom surface of the adhesion layer and a bottom surface of the encapsulant are coplanar, and a top surface of the first portion of the inductor, a top surface of the die stack structure and a top surface of the encapsulant are coplanar.

* * * * *